US00RE41441E

(19) United States
(12) Reissued Patent
Merritt

(10) Patent Number: US RE41,441 E
(45) Date of Reissued Patent: Jul. 13, 2010

(54) OUTPUT BUFFER HAVING INHERENTLY PRECISE DATA MASKING

(75) Inventor: Todd A. Merritt, Boise, ID (US)

(73) Assignee: Micron Technology, Inc., Boise, ID (US)

(21) Appl. No.: 10/006,785

(22) Filed: Nov. 9, 2001

Related U.S. Patent Documents

Reissue of:
(64) Patent No.: 5,983,314
Issued: Nov. 9, 1999
Appl. No.: 08/898,177
Filed: Jul. 22, 1997

(51) Int. Cl.
*G06F 12/00* (2006.01)
*G06F 13/00* (2006.01)
*G06F 5/00* (2006.01)
*G11C 7/00* (2006.01)

(52) U.S. Cl. ..... 711/105; 710/49; 710/52; 710/262; 365/189.05; 365/190; 365/202; 365/194

(58) Field of Classification Search ..... 365/80, 365/166, 120, 189.01, 190, 189.05, 202, 365/78, 189.12, 195–196, 233; 711/104–105, 711/109–110; 710/49, 52
See application file for complete search history.

(56) References Cited

U.S. PATENT DOCUMENTS 4,899,310 A * 2/1990 Baba et al. ..... 365/189.05
5,235,693 A * 8/1993 Chinnaswamy et al. ..... 711/159
5,381,540 A * 1/1995 Adams et al. ..... 710/130
5,383,154 A * 1/1995 Shibuya ..... 365/189.01
5,394,366 A * 2/1995 Miyamoto ..... 365/195
5,414,379 A * 5/1995 Kwon ..... 327/170
5,590,086 A 12/1996 Park et al. ..... 365/230.03
5,661,692 A * 8/1997 Pinkham et al. ..... 365/189.05
5,787,457 A * 7/1998 Miller et al. ..... 711/105

OTHER PUBLICATIONS

Mano Morris, Computer System Architecture, 1982, pp. 1, 264–265.*

* cited by examiner

*Primary Examiner*—Denise Tran
(74) *Attorney, Agent, or Firm*—Dorsey & Whitney LLP

(57) ABSTRACT

A maskable data output buffer includes an output stage receiving data signals from a data coder. The signals output from the data coder are normally complementary data signals corresponding to complementary data input signals. However, in response to receiving a mask signal, the data coder forces the output signals to be other than complementary. The output stage normally generates a data output signal corresponding to the complementary data input signals. However, when the data input signals are other than complementary, the output of the output stage assumes a high impedance condition. Since the timing of the high impedance condition is determined from the data signals themselves, the timing of the mask operation is inherently properly timed to the output of the data from the data output buffer.

58 Claims, 11 Drawing Sheets

OUTPUT BUFFER HAVING INHERENTLY PRECISE DATA MASKING

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a reissue of U.S. Pat. No. 5,983,314, issued Nov. 9, 1999. More than one reissue application has been filed for the reissue of U.S. Pat. No. 5,983,314. The reissue applications are application Ser. Nos. 10/006,785 and 10/460,813. Application Ser. No. 10/460,813 is a divisional reissue application of application Ser. No. 10/006, 785, now abandoned.*

TECHNICAL FIELD

This invention relates to memory devices, and more particularly to a data output buffer which may be used in a memory device in which a data masking control signal is inherently synchronized to data coupled through the buffer.

BACKGROUND OF THE INVENTION

Output buffers are commonly used in memory devices, such as dynamic random access memories ("DRAMs"), to supply data from a location in a memory array to one or more data bit terminals of the memory device during a memory read operation. The data bit terminal is commonly referred to as the "DQ" terminal. When a memory location storing a value of logic "1" is read, the output buffer receives complimentary logic "1" and logic "0" signals at respective DATA and DATA* input terminals and applies a logic "1" signal (which may be 3.3 volts or 5 volts, for example) to the DQ terminal. When a memory location storing a value of logic "0" is read from a memory location, the output buffer receives complimentary logic "0" and logic "1" signals at respective DATA and DATA* input terminals and applies a logic "0" signal to the DQ line. Although the prior art output buffers will be described as being a component of a DRAM, it will be understood that they are also used in devices other than DRAMs, such as in static random access memories ("SRAMs").

As output buffers have developed in speed and capability, they have been designed to perform additional functions. One of these functions is a data mask operation in which the data output terminal of the output buffer is switched to a high impedance or "tri-state" condition responsive to a data mask signal, known as a "DQM" signal. During this tri-state condition, the output buffer does not output any signal at the DQ terminal.

The conventional approach to masking a data signal output by a data output buffer is to apply the DQM signal to an active low enable input of an output buffer 10, as illustrated in FIG. 1. The DQM signal is applied to the enable output buffer 10 through a register 12 that is enabled by a clock ("CLK") signal. Thus, the DQM signal is registered to the edge of the CLK signal, although the DQM signal may be delayed to some degree in being coupled out of the register 12 to the output buffer 10. Similar, and often longer, delays may occur in coupling the DATA and DATA* signals to the output buffer 10.

During a normal read operation, the DQM signal is a logic "0" thereby enabling the output buffer 10. As a result, the output buffer 10 applies a data output signal to the DQ terminal that correspond to the complimentary DATA and DATA* inputs to the output buffer 10.

With reference to FIG. 2, when a masked data read operation is to occur, a logic "1" DQM signal is applied to the enable input of the output buffer 10. As is conventional, the output buffer operates with a read latency, which may be 2 clock cycles as shown in FIG. 2. In a latency of 2, an active DQM signal is applied to the output buffer 10 approximately 2 clock pulses before the data to be masked are applied to the DATA and DATA* input of the output buffer 10. Thus, the output buffer 10 is disabled approximately 2 clock pulses after DQM goes high. As a result, the output buffer 10 passes the first two bits of data, but its output is tri-stated during the third bit of data. Thus, during the time that DATA2 and DATA2* are applied to the output buffer 10 and the output buffer would otherwise output a corresponding DQ signal on the DQ terminals of the output buffer 10, the DQ terminal of the output buffer 10 becomes essentially open circuited. (The DATA* signal has been omitted from FIG. 2 since it is simply the compliment of DATA).

The above-described conventional approach to performing a masked data read operation is satisfactory if the DQM signal is properly synchronized with the DATA and DATA* signals. Under these circumstances, the output buffer 10 is disabled as illustrated in FIG. 2 in a manner in which the entire DATA2 signal is masked, but no part of either DATA1 or DATA3 is masked. However, in practice, particularly at higher operating speeds, the DQM signal is often not well synchronized to the DATA and DATA* signals. If an active high DQM signal is applied to the output buffer 10 too late relative to the DATA and DATA* signals, then the trailing part of the data bit prior to the desired data bit will be masked, and the trailing part of the desired data bit will not be masked. With reference to FIG. 3, the output buffer 10 is disabled after the DQM signal goes high with the same latency delay shown in FIG. 2. However, the DATA and DATA* signals are applied to the output buffer 10 later than as shown in FIG. 2. As a result, the trailing portion of the DQ1 bit is improperly masked, and the trailing portion of the DQ2 bit is improperly not masked. Under these circumstances, the DQ1 bit may be present for less than the output hold time $t_{OH}$ specified for a memory device using the output buffer 10. Furthermore, the output buffer 10 may fail to mask the DQ2 bit so that it is read by a processor (not shown) or other device performing the read operation. Although the problem illustrated in FIG. 3 has occurred because of an excessive delay in applying the DATA and DATA* signals to the output buffer 10, the same problem occurs if the DQM signal is applied with insufficient delay (i.e. to early), or any combination of the DATA and DATA* signals applied too late and the DQM signal applied too early.

A problem similar to that illustrated in FIG. 3 occurs if the DQM signal is applied to the output buffer 10 too late, the DATA and DATA* signals are applied to early, or any combination of the two. With reference to FIG. 4, the output buffer 10 is once again disabled after the DQM signal goes high with the same latency delay shown in FIGS. 2 and 3. However, the DATA and DATA* signals are applied to the output buffer 10 earlier than as shown in FIG. 2. As a result, the leading portion of the DQ2 bit is improperly not masked, and the leading portion of the DQ3 bit is improperly masked. Under these circumstances, the DQ3 bit may be present for less than the output hold time $t_{OH}$ specified for a memory device using the output buffer 10. Furthermore, the output buffer 10 may once again fail to mask the DQ2 bit so that it is read by a processor (not shown) or other device performing the read operation.

Although both of the above-described problems could theoretically be solved by precisely synchronizing the DQM signal to the DATA and DATA* signals as they are applied to the output buffer 10, in practice it is not possible to synchronize the signals to each other with adequate precision. Furthermore, the delays are difficult to predict and may vary with time with different memory devices and with different systems using the memory devices, thus making it impractical to synchronize the signal to each other by imposing a compensating delay on either the DQM signal or the DATA and DATA* signals. There is thus a need for an output buffer that is capable of precisely masking the entire portion of a desired data bit without masking any portion of adjacent data bits.

SUMMARY OF THE INVENTION

In accordance with one aspect of the invention, an output buffer includes a data coder adapted to receive complimentary read data signals and a data mask signal, and an output stage received coded read data signals from the data coder. The coded read data signals from the data coder correspond to the complimentary read data signals in the absence of the data mask signal. The data coder codes the encoded read data signals in a predetermined manner, such as having the same value rather than being complimentary, responsive to the data mask signal. In the event the coded read data signals are not coded in the predetermined manner, the output stage generates on a data output terminal an output signal having a value corresponding to the coded read data signals. If the coded read data signals are coded in the predetermined manner, the output stage causes its data output terminal to have a high impedance. The data coder preferably includes a data mask register and a data output register coupled to the data mask register. The data coder is adapted to receive the data mask control signal and a periodic clock signal, and generates an output signal registered to a predetermined portion of the clock signal after the data mask control signal becomes active. The data output register forces the coded read data signals to have the predetermined values responsive to the output signal from the data mask register. The data mask registers also preferably includes a latency control circuit adapted to receive a latency control signal and to alter the time when the data mask register generates the output signal as a function of the latency control signal. The data output register preferably includes a multi-phase signal generator receiving a periodic clock signal and generating from the clock signal a plurality of differently-phased input data enable signals and output data enable signals. The data output register preferably further includes a plurality of latches each storing the read data signals responsive to a respective differently-phased input data enable signal and outputting the stored read data signals responsive to a respective differently-phased output data enable signal. The output stage preferably includes a logic circuit that causes the output signal applied to the data output terminal to have a first logic level responsive to one of the coded data read output signals having a first predetermined logic level, that causes the output signal applied to the data output terminal to have a second logic level responsive to the other of the coded data read output signals having a second predetermined logic level, and that causes the data output terminal to have the relatively high impedance responsive to both of the coded read output signals having other than the first and second predetermined logic levels. The output stage preferably comprises a first switch coupled between a first voltage node and the data output terminal, and a second switch coupled between a second voltage node and the data output terminal. A logic circuit closes the first switch responsive to one of the coded data read signals having the first predetermined logic level, opens the first switch responsive to the coded data read signal having other than the first predetermined logic level, closes the second switch responsive to the other of the coded data read signals having the second predetermined logic level, and opens the second switch responsive to the coded data read signal having other than the second predetermined logic level. The output buffer may be used in a memory device, such as a dynamic random access memory, which may be a component of a computer system having a processor, an input device, an output device, and a data storage device.

DETAILED DESCRIPTION OF THE INVENTION

Figure 1:
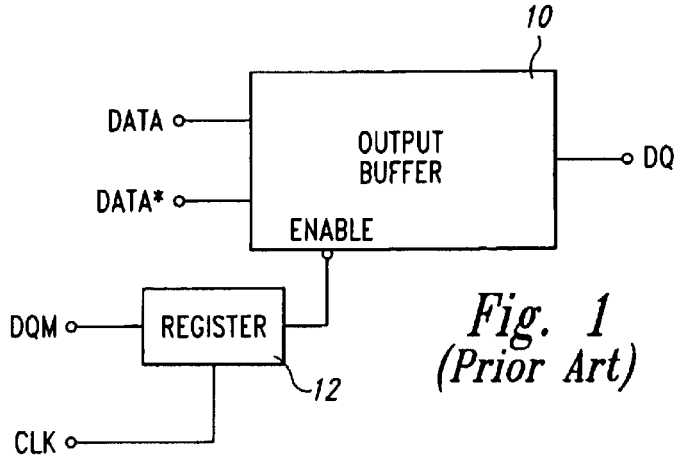
Fig. 1 (Prior Art)
FIG. 1 is a block diagram of a prior art memory device employing a prior art data output buffer.
Figure 2:
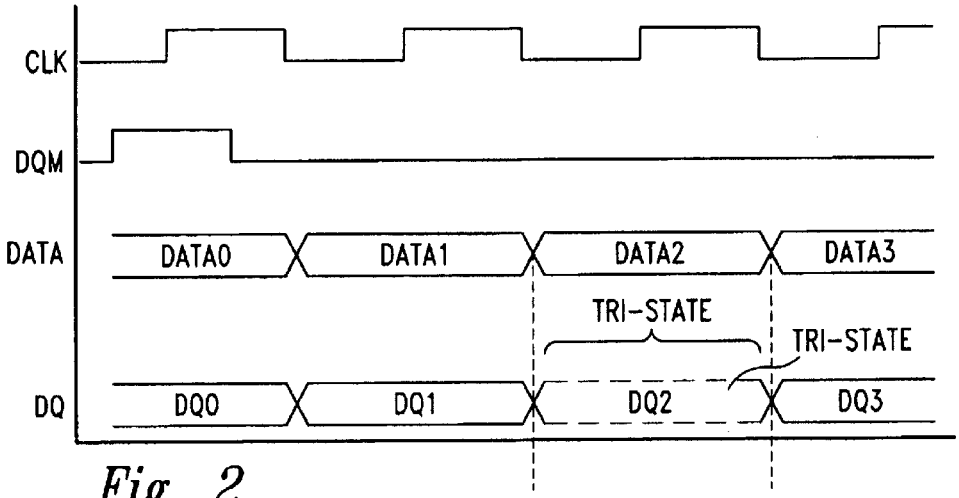
Fig. 2 (Prior Art)
FIG. 2 is a timing diagram showing signals applied to and received from the data output buffer of FIG. 1 in which a data masking control signal is properly synchronized to data coupled though the buffer.
Figure 3:
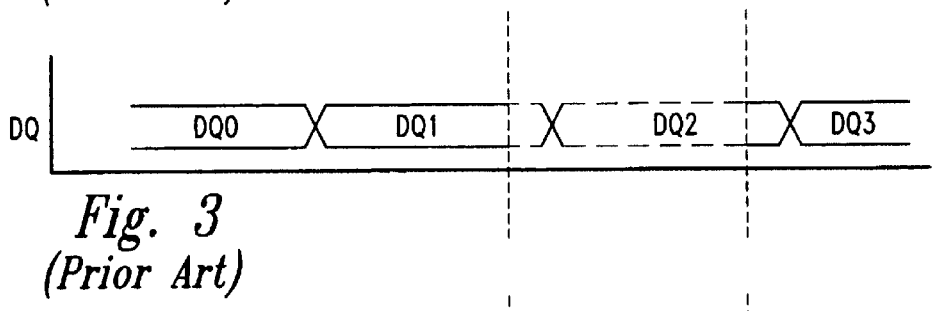
Fig. 3 (Prior Art)
FIG. 3 is a timing diagram showing signals applied to and received from the data output buffer of FIG. 1 in which data coupled though the buffer is masked too quickly.
Figure 4:
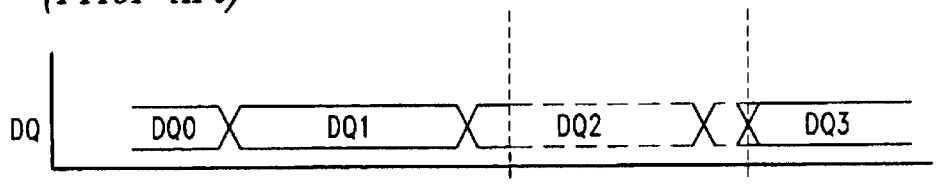
Fig. 4 (Prior Art)
FIG. 4 is a timing diagram showing signals applied to and received from the data output buffer of FIG. 1 in which data coupled though the buffer is masked too slowly.
Figure 5:
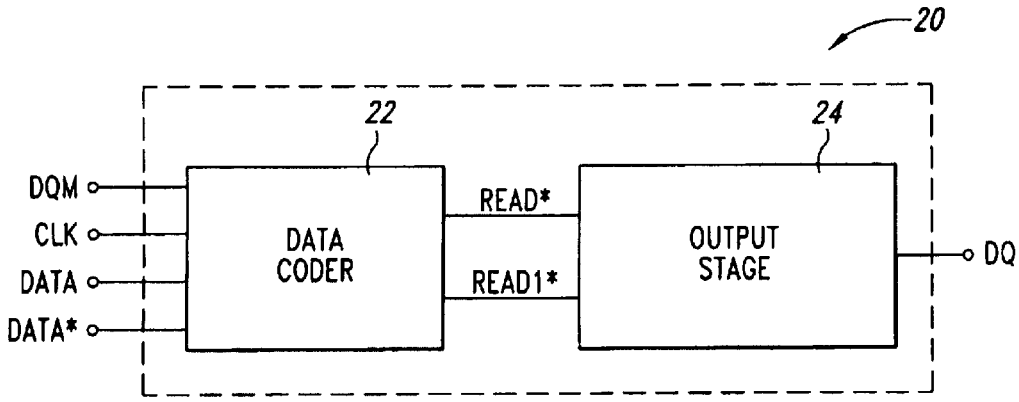
FIG. 5 is a block diagram of a data output buffer according to a preferred embodiment of the invention.

A preferred embodiment of an output buffer 20 in accordance with the invention is illustrated in FIG. 5 and will be explained with reference to the timing diagram of FIG. 6. The output buffer includes a data coder 22 that receives complimentary data signals DATA and DATA* from an array in a memory device (not shown in FIG. 5), a periodic clock CLK signal, and a data mask DQM signal. The data coder 22 drives an output stage 24 with signals DATA0* and DATA1* that are complimentary except when the output stage 24 is to be tri-stated during a data mask operation. Thus, for example, during the period from $t_0$ to $t_2$ of FIG. 6, the READ0* and READ1* signals correspond to the DATA and DATA* signals, respectively. However, it will be noted that the DQM signal goes active high at just prior to time $t_4$. After a predetermined latency delay period (2 clock cycles in the example of FIG. 6), the READ0* and READ1* signals are no longer the compliment of each other at time $t_5$. Instead, during the period between $t_5$ and $t_7$, the READ0* and READ1* signals are both high. After $t_7$, the READ0* and READ1* signals once again correspond to the DATA and DATA* signals, and are thus the compliment of each other. In summary, when the data is not being masked, the READ0* and READ1* signals correspond to the complimentary DATA and DATA* signals. When the data read from a memory device is to be masked, the READ0* and READ1* signals are identical and thus no longer correspond to the DATA and DATA* signals, respectively.

Figure 6:
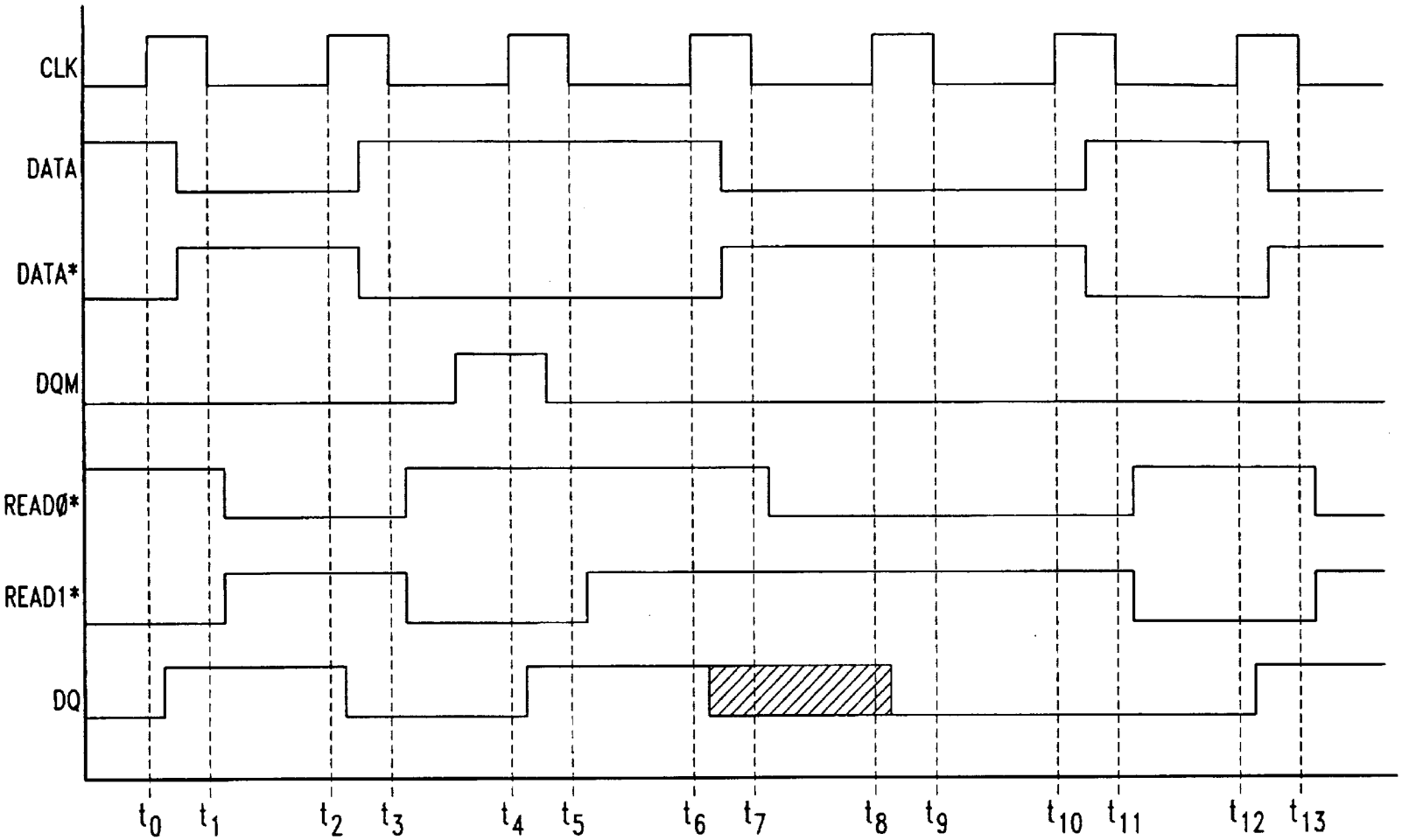
FIG. 6 is a timing diagram showing signals applied to and received from the data output buffer of FIG. 5.

As further illustrated in FIG. 6, the output stage 24 generates a DQ signal on a DQ output line that corresponds to the READ0* and READ1* signals are complimentary. Thus, during the period to through $t_2$, the DQ signal corresponds to the DATA signal. However, the output stage 24 recognizes that the READ0* and READ1* signals are no longer the compliment of each other between $t_5$ and $t_7$ and, in response thereto, tri-states its DQ output line to a high impedance.

It is important to note that the timing of the tri-state condition is precisely aligned with the DQ signal even though the DQM signal was not asserted in synchronism with either the CLK signal or the DATA and DATA* signals. By coding the data signals READ0* and READ1* with instructions to tri-state the DQ output line, the tri-stating of the DQ output line is inherently aligned with the data to be masked.

Figure 7:
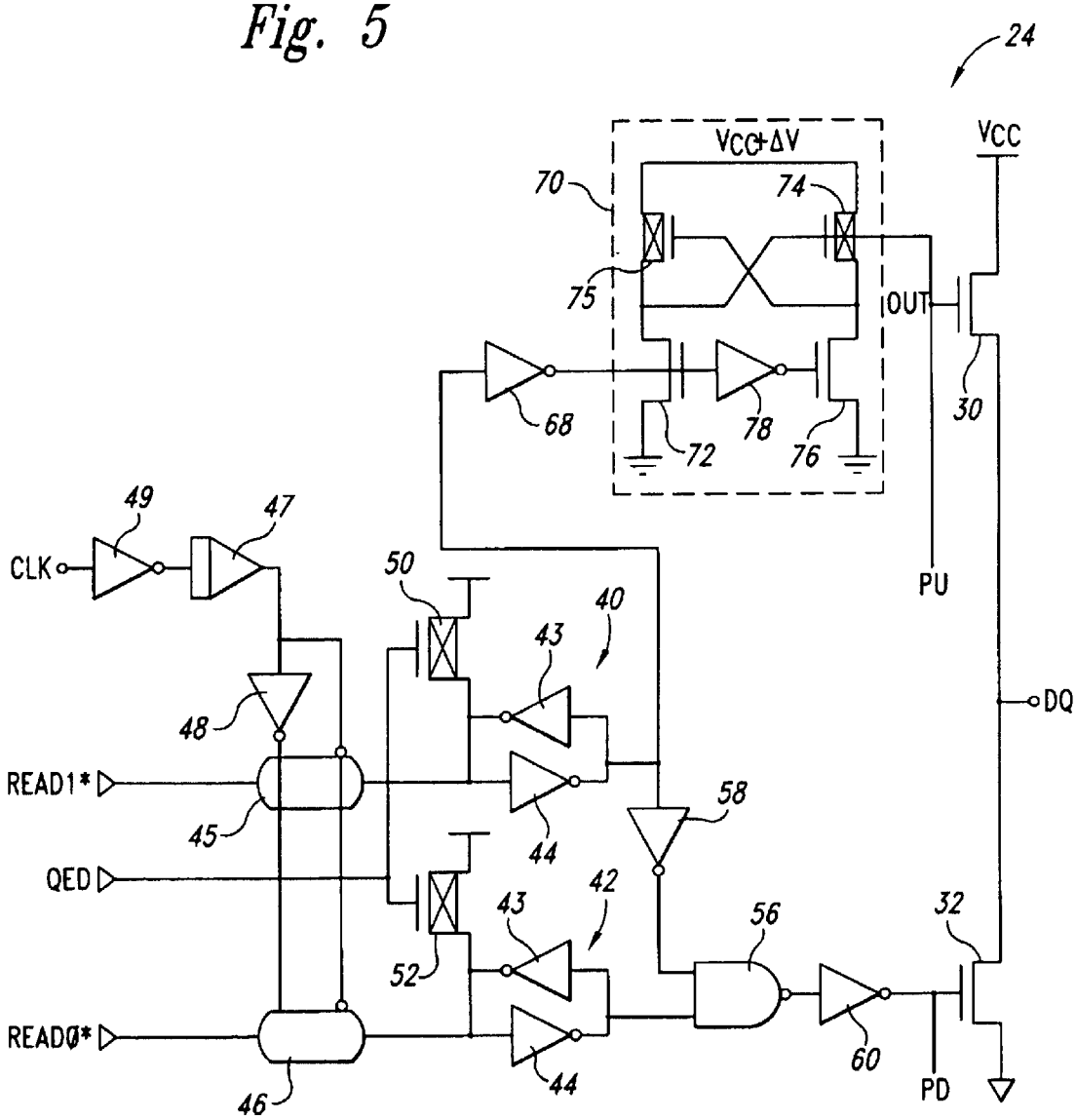
FIG. 7 is a schematic and logic diagram of a preferred embodiment of a data output stage used in the data output buffer of FIG. 5.

A preferred embodiment of the output stage 24 usable in the preferred embodiment of the output buffer 20 of FIG. 5 is illustrated in FIG. 7. The DQ signal is generated at the junction of the source of a first NMOS transistor 30 and the drain of a second NMOS transistor 32. The drain of the NMOS transistor 30 is coupled to a supply voltage while the source of the NMOS transistor 32 is coupled to ground. Thus, when a pull-up PU signal applied to the gate of the NMOS transistor 30 is high and a pull-down PD signal applied to the gate of the NMOS transistor 32 is low, the transistor 30 is ON and the transistor 32 is OFF, thereby driving the DQ terminal to a logic "1" voltage level. When the pull-up PU signal is low and the pull-down PD signal is high, transistor 30 is OFF and transistor 32 is ON, thereby driving the DQ terminal to a logic "0" voltage level. Finally, when both the pull-up PU signal and the pull-down PD signal are low, both transistors 30 and 32 are OFF, thereby tri-stating the DQ terminal to a high impedance level.

The function of the remaining circuitry in the output stage 24 is primarily to drive the PU and PD signals to correspond to the READ0* and READ1* signals, respectively, except when the READ0* and READ1* signals are both high. More specifically, the output stage 24 drives the PU signal high and the PD signal low when the READ0* signal is high and the READ1* signal is low. The output stage 24 drives the PU signal low and the PD signal high when the READ0* signal is low and the READ1* signal is high. Finally, the output stage 24 drives both the PU signal and the PD signal low when the READ0* signal and the R1* signal are both high. The manner in which the output stage 24 performs these functions will now be explained in detail.

The READ0* and READ1* signals are applied to the inputs of respective latches 40, 42, each of which is formed by a pair of inverters 43, 44, through a pair of transmission gates 45, 46 which are selectively enabled by a signal at the output of a delay circuit 47 applied directly and through an inverter 48. The delay circuit 47 is driven by the clock CLK signal through an inverter 49. As explained below, the purpose of the transmission gates 45, 46 and associated circuitry is to couple the READ1* and READ0* signals to the latches 40, 42 at the proper time, i.e., during the ½ clock cycle starting shortly after the clock CLK signal goes high. For the purpose of explaining the operation of the output stage 24, it will be assumed that the transmission gates 45, 46 are continuously enabled.

Assuming that the transmission gates are enabled, the READ1* and READ0* signals are applied to the inputs of the latches 40, 42, respectively, which are selectively pulled high by respective PMOS transistors 50, 52 each of which are driven by an enable QED signal. During normal operation, the QED signal is high, thereby turning off the transistors 50, 52 to allow the latches 40, 42 to function in a normal manner. As explained below, when the QED signal is low, the DQ output line is tri-stated. Unless otherwise stated, the operation of the output stage 24 will be explained with the understanding that the QED signal is high, thereby enabling the output stage 24.

When the READ0* signal is low, the output of the latch 42 is high, thereby enabling a NAND gate 56. The other input of the NAND gate is coupled to the output of the latch 40 though an inverter 58. If READ1* is high, the output of the latch 40 is low, thereby causing the inverter 58 to output a high to the NAND gate 56. Thus, when the READ0* signal is low and the READ1* signal is high, the NAND gate 56 outputs a low which causes an inverter 60 to output a high PD signal to the gate of the NMOS transistor 32, thereby turning on the transistor 32 and pulling the DQ terminal low. The low at the output of the latch 40 resulting from the high READ1* signal is also applied to an inverter 68 which drives a level translator circuit 70. The high at the output of the inverter 68 turns ON an NMOS transistor 72 in the level translator circuit 70. The ON transistor 72 then pulls the gate of a PMOS transistor 74 and the pull-up PU signal low. The low applied to the gate of the PMOS transistor 74 turns on the transistor 74 to bias the gate of a PMOS transistor 75 high, thereby turning OFF the transistor 75. Although the drain of an NMOS transistor 76 is driven high by the ON PMOS transistor 74, no current is conducted through the transistor 76 since its gate is biased low through an inverter 78. The low PU signal turns OFF the NMOS transistor 30. Thus, when the READ0* signal is low and the READ1* signal is high, only the transistor 32 is turned on to drive the DQ terminal low.

When the READ0* signal is high, the output of the latch 42 is low, thereby disabling the NAND gate 56. The NAND gate 56 then outputs a high which causes the inverter 60 to output a low, thereby making the pull down PD signal low to turn OFF the transistor 32. If the READ1* signal is low when the READ0* signal is high, the latch 40 outputs a high which performs two functions. First, the high at the output of the latch 40 causes the inverter 58 to output a low, thereby ensuring that the NAND gate 56 is disabled to turn OFF the transistor 32. Thus, if the READ1* signal is low, the transistor 32 will be turned OFF regardless of the state of the READ0* signal. Second, the high at the output of the latch 40 causes the inverter 68 to output a low, thereby turning OFF the NMOS transistor 72. At the same time, the low at the output of the latch 40 causes the inverter 78 to turn ON the transistor 76. The transistor 76 then pulls the gate of the PMOS transistor 75 low to turn ON the transistor 75. As a result, the ON PMOS transistor 75 drives the pull up PU signal high to turn ON the transistor 30 and maintain PMOS transistor 74 OFF. Thus, when the READ0* signal is high and the READ1* signal is low, only the transistor 30 is turned on, thereby driving the DQ terminal high.

When the READ0* and the READ1* signals are both high, the high READ1* signal turns OFF the transistor 30 in the same manner as explained above for the READ0* signal being low and the READ1* signal being high. Similarly, the low at the output of the latch 46 resulting from the high READ0* signal disables the NAND gate 56, thereby turning OFF the transistor 32 in the same manner as explained above for the READ0* signal being high and the READ1* signal being low. Thus, when the READ0* and READ1* signals are both high, both of the transistors 30 and 32 are turned OFF, thereby tri-stating the DQ terminal to a high impedance.

As mentioned above, the enable signal QED is normally high to enable the operation of the output stage 24, and the output stage 24 tri-states its DQ terminal if the QED signal is low. The low QED signal performs this function because the outputs of both latches 40, 42 are driven low whenever the transistors 50, 52, respectively, are turned ON by the low QED signal. The low at the output of the latch 40 turns OFF the transistor 30 in the same manner as explained above for the READ0* signal being low and the READ1 * signal being high. Similarly, the low at the output of the latch 42 turns OFF the transistor 32 in the same manner as explained above for the READ0* signal being high and the READ1 * signal being low.

Although the READ0* and READ1* signals both being low is not a valid operational state, it should be recognized that this state will not cause both transistors 30, 32 to be ON. While the low READ1* signal will turn ON the transistor 30 in the same manner as explained above for the case of READ0* being high and the READ1* being low, the low READ0* signal will not turn ON the transistor 32 in the same manner as explained above for the case of READ0* being low and the READ1* being high. This is because the low READ1* signal disables the NAND gate 56 so that the high coupled to the other input of the NAND gate 56 because of the low READ0* signal cannot cause the NAND gate 56 to output a low. Instead, the NAND gate 56 outputs a high, thereby turning OFF the transistor 32. Thus, if the READ0* and the READ1* signals are both low, only the transistor 30 will be turned ON.

In summary, the logic level of the DQ signal at the DQ terminal corresponds to the logic level of the READ0* signal as long as the READ0* signal is the compliment of the READ1* signal. If the READ0* signal and the READ1* signal are both high, the DQ terminal is tri-stated to a high impedance.

Figure 8:
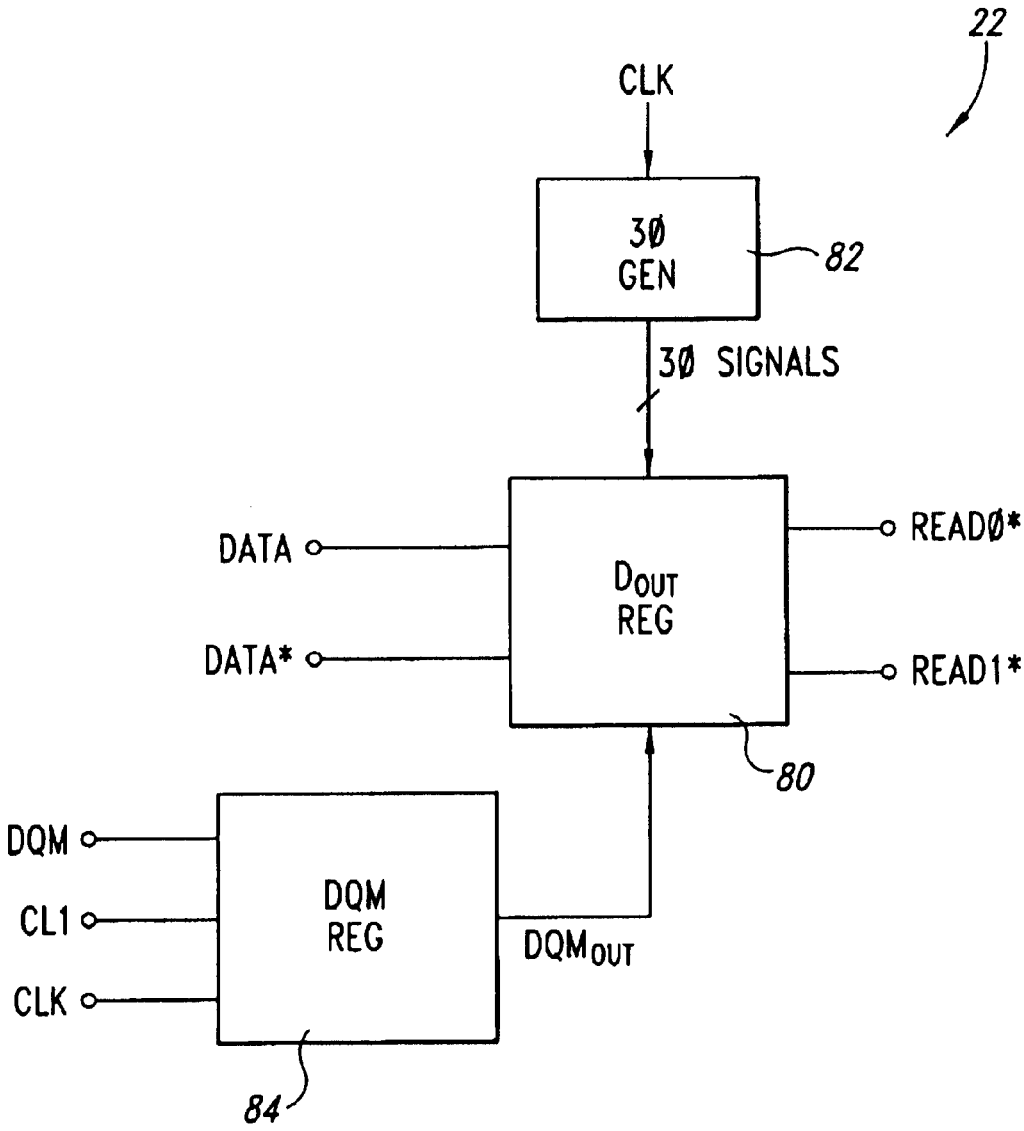
FIG. 8 is a block diagram of a preferred embodiment of a data coder used in the data output buffer of FIG. 5.

A preferred embodiment of the data coder 22 of FIG. 5 is illustrated in FIG. 8. Complementary data signals DATA and DATA* from a memory array (not shown in FIG. 9) are applied to a data out register 80. The data out register 80 also receives three phases of enable and data latch signals from a three phase generator 82. The three phase signals applied to the data out register 80 are generated by the three phase generator 82 from the clock CLK signal. The data out register 80 also receives a DQM out signal from a DQM register 84. Basically, the DQM register 84 controls the timing of the DQM-out signal responsive to a DQM input signal with a read latency determined by a CL1 input. The DQM register 84 also receives the clock CLK signal to control the timing of the DQM-out signal. In response to the complementary data signals DATA and DATA* and the signals received from the three phase generator 82 and DQM register 84, the data out register 80 generates the READ0* AND READ1* signals having the characteristics described above with reference to the output stage 24. In particular, in the absence of a DQM signal, the READ0* and READ1* signals correspond to the DATA and DATA* signals. However, in response to a DQM signal, the READ0* and READ1*, the data output register 80 drives both the READ0* signal and the READ1* signal high at the appropriate time to cause the DQ output of the terminal stage 24 (FIG. 5) to have a high impedance.

Figure 9:
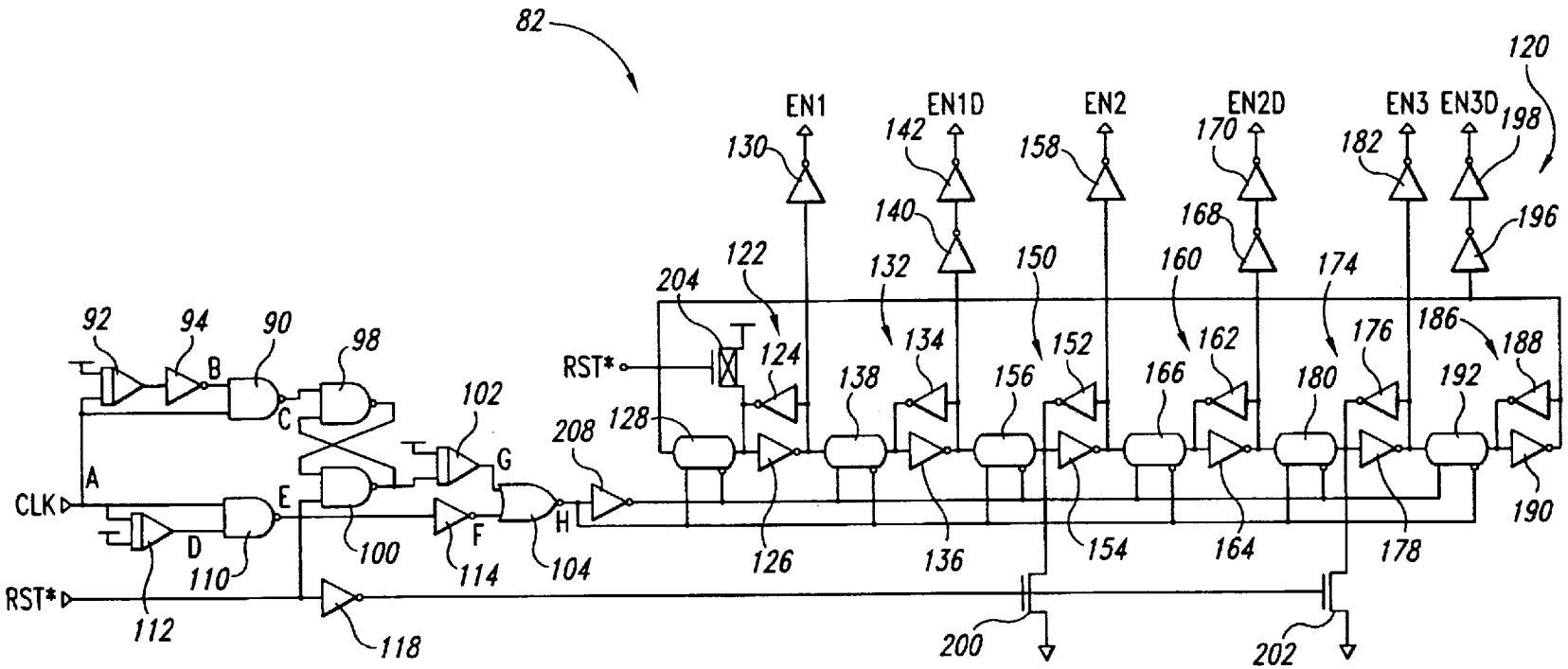
FIG. 9 is a schematic of a preferred embodiment of a 3-phase signal generator used in the data coder of FIG. 8.

A preferred embodiment of the three phase signal generator 82 is illustrated in FIG. 9. The operation of the three phase signal generator 82 will be explained with reference to the timing diagram of FIG. 10 in which various signal nodes in FIG. 9 have been designated with corresponding reference letters. The clock signal on node A is applied to a NAND gate 90, both directly and through a delay circuit 92, and an inverter 94. The delayed and inverted clock signal is shown as signal "B" in FIG. 10. The output of the NAND gate 90 (signal C) is high except for a short period at the leading edge of the clock signal for a duration corresponding to the duration of the delay circuit 92. The output of the NAND gate 90 is applied to a NAND gate 98 which is connected to a second NAND gate 100 to form a flip-flop. The flip-flop 100 is initially held in a reset condition by RST* being low which is applied to the input of the NAND gate 100. Thus, the output of the NAND gate 100 is initially high which is coupled through a delay circuit 102 to disable a NOR gate 104. Thus, the output of the NOR gate 104 (node H) is initially at a stable low value.

Figure 10:
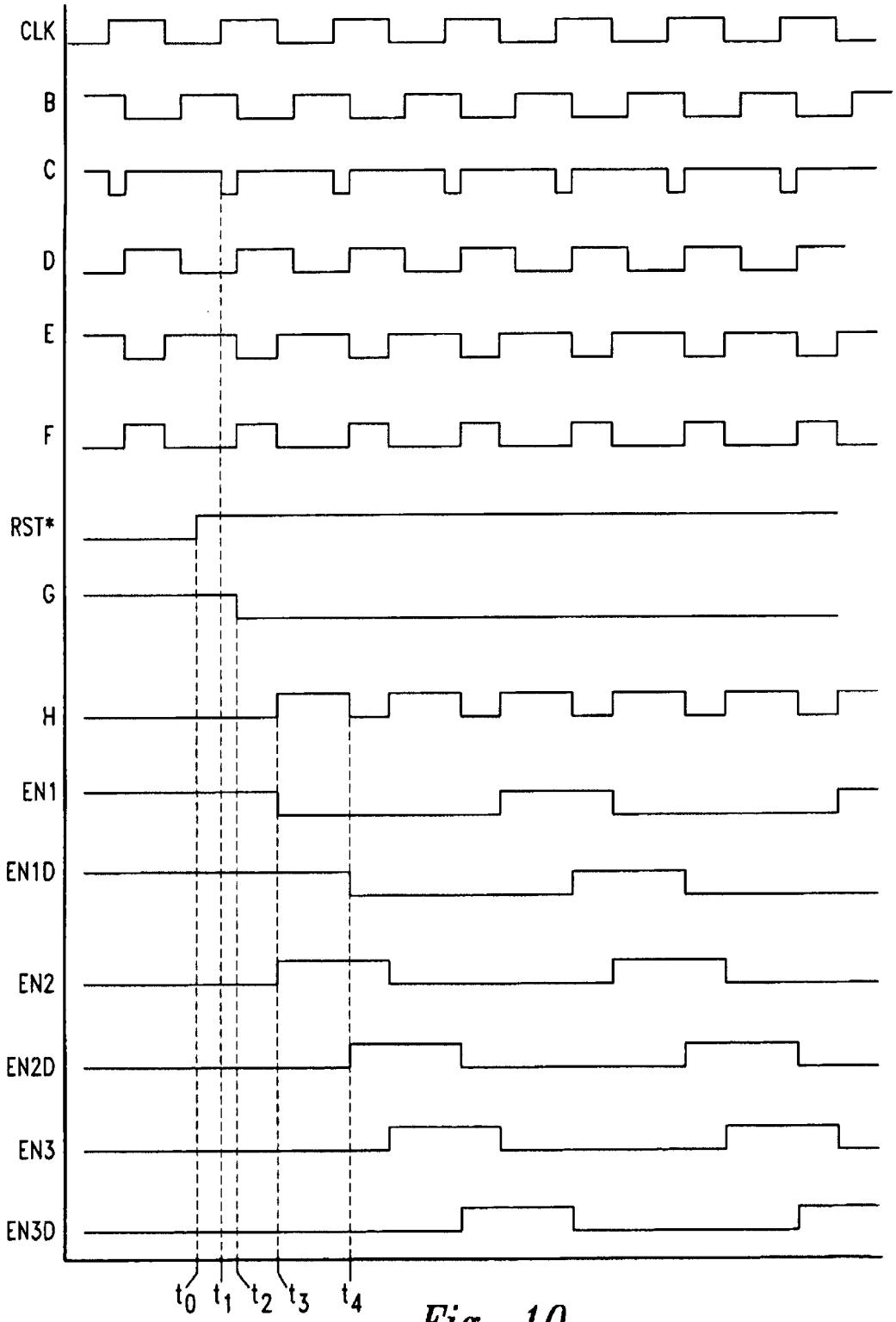
FIG. 10 is a timing diagram showing signals applied to and received from the 3-phase signal generator of FIG. 9.
Figure 11:
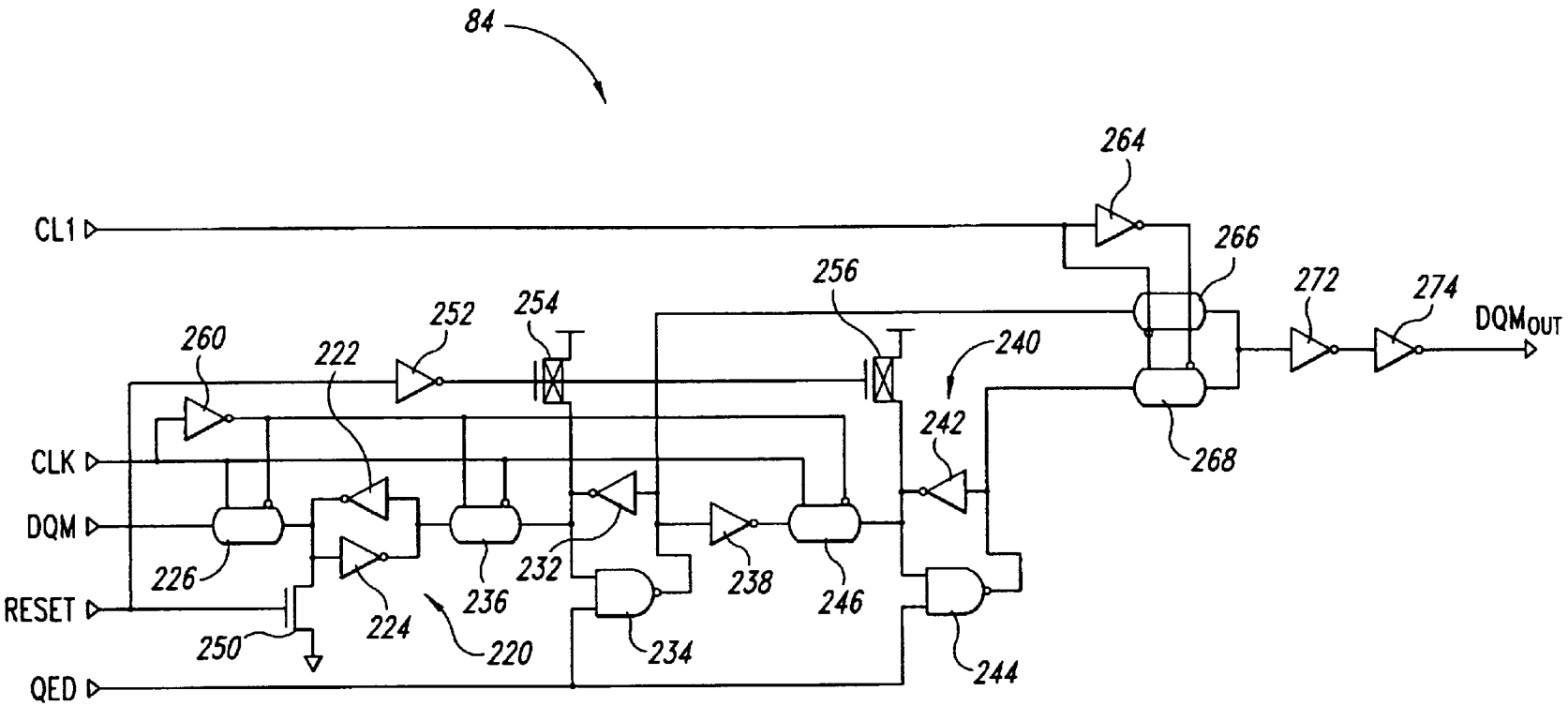
FIG. 11 is a schematic of a preferred embodiment of a DQM Register used in the data coder of FIG. 8.

The clock's CLK signal is also applied to a NAND gate 110 both directly and through a delay circuit 112. The output of the delay circuit 112, as shown as signal D in FIG. 11, is simply a delayed version of the clock CLK signal. The NAND gate 110 outputs at node E a signal that is high except for the portion of the clock signal following the delay established by the delay circuit 112. This signal at node E is applied through an inverter 114 to the other input of the NOR gate 104. The output of the inverter 114 is shown as signal "F" in FIG. 10. The periodic signal at the output of the inverter 114 initially has no effect on the remainder of the three phase signal generator illustrated in FIG. 9 because, as explained above, the NOR gate 104 is disabled until the flip-flop formed by the NAND gates 98, 100 is set.

As mentioned above, the reset RST* signal is initially active low. This RST* signal is applied through an inverter 118 to generate signals for controlling the initial condition of a closed loop of latches 120. A first latch 122 is formed by a pair of inverters 124, 126 connected to each other input-to-output, and an input transmission gate 128. The output of the latch 122 is coupled through an inverter 130 to generate a first enable signal EN1. A second latch 132 is formed by a pair of inverters 134, 136 connected to each other input-to-output and to an input transmission gate 138 in the same manner as explained above with reference to the latch 122. The output of the latch 132 is coupled through a pair of inverters 140, 142 to generate a first data input signal EN1D. Similarly, a third latch 150 is formed by a pair of inverters 152, 154, and an input transmission gate 156. The output of the latch 150 is coupled through an inverter 158 to generate a second enable signal EN2. A fourth latch 160 is formed by inverters 162, 164 and a transmission gate 166, and outputs through inverters 168, 170 a second data input signal EN2D. Still another latch 174 is formed by a pair of inverters 176, 178 and an input transmission gate 180, and outputs through an inverter 182 a third enable signal EN3. Finally, a sixth latch 186 is formed by a pair of inverters 188, 190 and an input transmission gate 192. The output of the latch 186 is coupled through a pair of inverters 196, 198 to generate a third data input signal EN3D. The output of the latch 186 is also coupled back to the input transmission gate 128 of the first latch 122.

As mentioned above, the initial conditions of the loop 120 are controlled by the reset RST* signal and its complement at the output of the inverter 118. The high at the output of the inverter 118 is applied to the gates of a pair of NMOS transistors 200, 202 to cause respective latches 150, 174 to output a logic "1" which causes EN2 and EN3 to be low, as illustrated in FIG. 10. The RST* signal is also applied to the gate of a PMOS transistor 204 which causes the latch 122 to output a logic "0" thereby causing EN1 to be high, as illustrated in FIG. 10. Also, since the output of the NOR gate 104 (node H) is initially low, the output of the NOR gate 104 and its complement at the output of an inverter 208 enable the transmission gates 138, 166 and 192. As a result, the output of the latch 122 is coupled to the input of the latch 132 thereby making EN1D initially high, as illustrated in FIG. 10. In a similar manner, the output of the latch 150 is coupled through the pass gate 166 to the latch 160 and the output of the latch 174 is coupled through transmission gate 192 to the latch 186, thereby making EN2D and EN3D initially low.

The operation of the three phase signal generator 82 departs from its initial conditions when the RST* signal goes inactive high at $t_0$, as illustrated in FIG. 10. The high RST* removes the reset from the NAND gate 100 so that the output of the NAND gate 90 (signal C) can set the flip-flop formed by NAND gates 98, 100 at the next leading edge of the clock at $t_1$. After a short delay produced by the delay circuit 102, the NOR gate 104 is enabled by the input to the NOR gate (signal G) going low at $t_2$. Thereafter, the periodic signal at the output of the inverter 114 (signal F) is coupled through the NOR gate 104. Whenever the output of the NOR gate 104 (signal H) goes low, the transmission gates 138, 166 and 192 are enabled. Whenever the output of the NOR gate 104 goes high, the transmission gates 128, 156 and 180 are enabled. Thus, at time $t_3$, the low at the output of the latch 186 is coupled through the transmission gate 128 to cause EN1 to go low. At the same time, the high at the output of the latch 132 is coupled through the transmission gate 156 to cause EN2 to go high. Although the transmission gate 180 also couples the output of the latch 160 to the latch 174 at this time, since the output of the latch 162 was low and the input of the latch 174 was initially held low by the NMOS transistor 202, the state of the EN3 signal does not change. Although the EN1 and EN2 signals transition at $t_3$, those transitions do not affect the EN1D and EN2D signals because the transmission gates 138 and 164 are disabled at $t_3$ when the output of the NOR gate 104 goes high.

When the output of the NOR gate 104 (signal H) goes low at time $t_4$, the transmission gate 138, 166 and 192 are enabled while the transmission gates 128, 136, 164 are disabled. As a result, the high at the output of latch 122 is coupled to the input of the latch 132 thereby causing the EN1D signal to go low. At the same time, the low at the output of the latch 150 is coupled to the input of the latch 160, thereby causing the EN2D signal to go high. In a similar manner, the high EN2 and EN2D signals propagate through the latches so that only one of the enable signals EN1–EN3 is high, with the enable signals being equally phased from each other. Similarly, only one of the data input signals EN1D–EN3D is high at a time, with the data input signals being equally phased from each other. As explained below, these three phase enable and data input signals are used by the data out register 80 (FIG. 8) to retain the data signals DATA and DATA* for the proper period to account for a read latency and then apply the READ0* and READ1* signals to the output stage 24 (FIG. 5) at the appropriate time.

A schematic of the DQM register 84 (FIG. 8) is illustrated in FIG. 11 and explained with reference to the timing diagram of FIG. 12. The primary purpose of the DQM register 84 is to register the DQM-out signal at either the rising edge or the falling edge of the clock CLK signal, depending on whether the read latency is two or three. As a result, unpredictable delays of the DQM signal are compensated for since the DQM-out signal is always generated at the rising edge or the falling edge of the clock CLK signal. The DQM signal is applied to a first latch 220 formed by a pair of inverters 222, 224 connected input-to-output and an input transmission gate 226. The output of the first latch 220 is applied to a second latch 230 formed by an inverter 232 and a NAND gate 234 connected output-to-input and an input transmission gate 236. In operation, the NAND gate 234 functions as an inverter when it is enabled by a high enable QED signal. The output of the latch 230 is applied through an inverter 238 to a third latch 240 also formed by an inverter 242, a NAND gate 244 and an input transmission gate 246.

The initial conditions of the latches 220, 230, 240 are determined by a RESET input. The RESET input is applied to the gate of an NMOS transistor 250 which forces the output of the latch 220 high when RESET is active high. The RESET input is also applied through an inverter 252 to the gates of respective PMOS transistors 254, 256. The PMOS transistors 254, 256 force the output of the latches 230, 240 low when RESET is active high. Thus, the output of the first latch 220 is initially high while the output of the second and third latches 230, 240, respectively, is initially low, as illustrated in FIG. 12.

The transmission gates 226, 236, 246 are selectively enabled by the clock CLK signal and its complement present at the output of an inverter 260. The first and third transmission gates 226, 246 are simultaneously enabled, while the second transmission gate 236 is enabled when the first and third transmission gates 226, 246 are disabled.

The remaining input signal CL1 is used to control the timing of the DQM-out signal depending upon the read latency of a memory device using the inventive output buffer. The CL1 signal and its complement at the output of an inverter 264 are applied to two transmission gates 266, 268. When CL1 is low, the transmission gate 266 is enabled and the transmission gate 268 is disabled, so that the output of the latch 230 is coupled through the transmission gate 266 and a pair of inverters 272, 274 to the DQM-output terminal. When CL1 is high, the output of the latch 240 is coupled through the transmission gate 268 and the inverters 272, 274.

Figure 12:
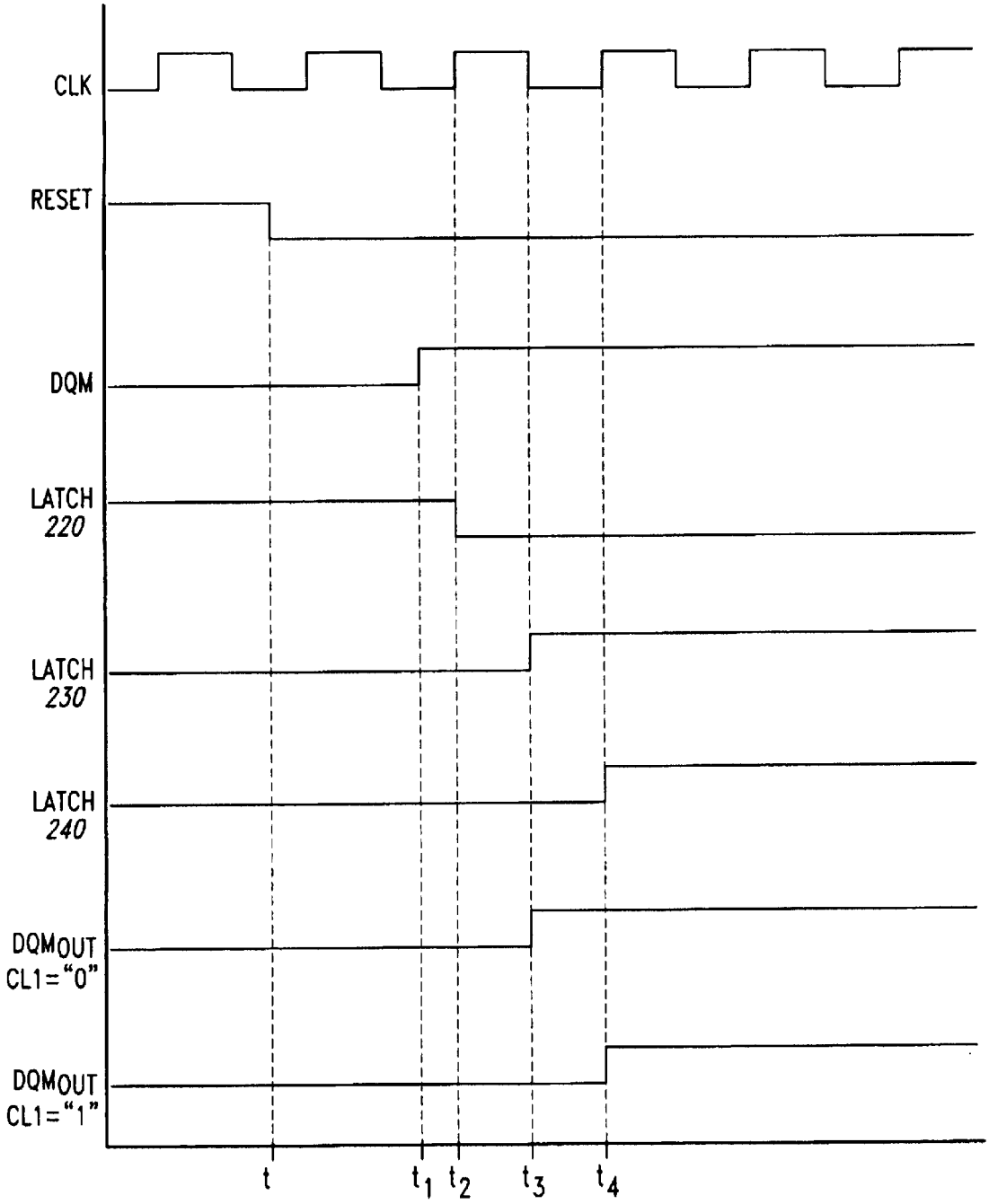
FIG. 12 is a timing diagram showing signals applied to and received from the DQM Register of FIG. 11 for two different read latency values.

In operation, the DQM register 84 remains in its initial state forced by the RESET as illustrated in FIG. 12. When RESET goes low at $t_0$, the values of the latches 220, 230, 240 are no longer forced at their initial values. However, as long as DQM remains low, the condition of the latches 220, 230, 240 do not change since the input to the inverter 224 in the latch 220 was initially set low and remains low when the low DQM signal is coupled through the transmission gate 226. However, when DQM goes high at $t_1$, the high is coupled through the transmission gate 226 on the next rising edge of the clock at $t_2$. On the next falling edge of the clock at $t_3$, the low at the output of the latch 220 is coupled through the transmission gate 236 to cause the output of the latch 230 to go high. In the event CL1 is low, the high output of the latch 230 is coupled through the transmission gate 266 and the inverters 272, 274 to cause the DQM-out signal to go high at $t_3$, as illustrated in FIG. 12. On the next rising edge of the clock CLK signal at $t_4$, the high at the output of the latch 230 is coupled through the inverter 238 and the transmission gate 246 to cause the output of the latch 240 to go high. In the event that CL1 is high, the high at the output of the latch 240 is coupled through the transmission gate 268 and inverters 272, 274 to cause the DQM-out signal to go high at $t_4$.

It is thus seen that, once the active high RESET signal is removed, the DQM register functions to drive the DQM-out signal high on either the falling edge of CLK (if CL1 is low) or the second rising edge of CLK (if CL1 is high) after DQM goes high regardless of the exact timing of the DQM signal. As explained below, this delay in generating DQM out is adapted to correspond to the read latency of a memory device in which the output buffer is used.

Figure 13:
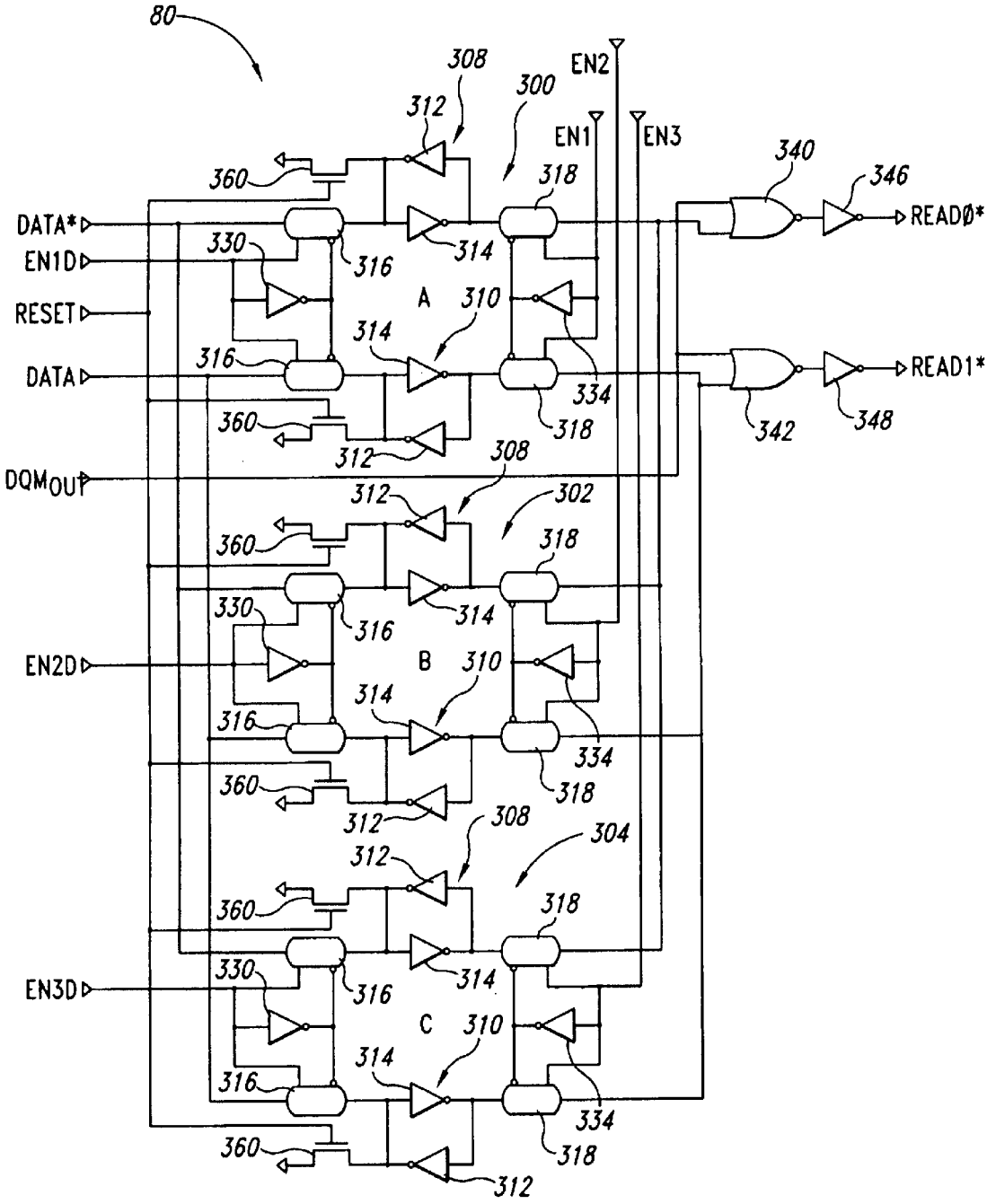
FIG. 13 is a schematic of a preferred embodiment of a Data Out Register used in the data coder of FIG. 8.
Figure 14:
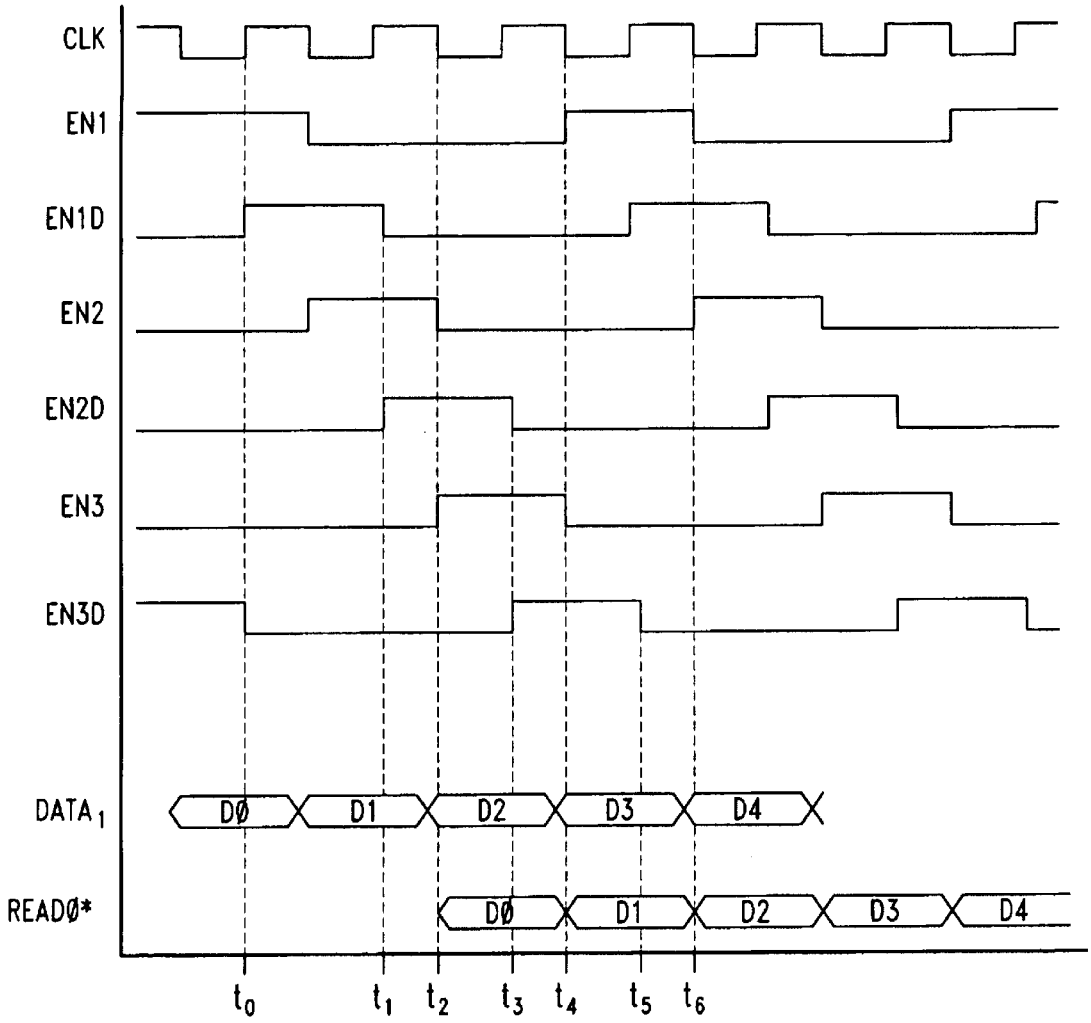
FIG. 14 is a timing diagram showing signals applied to and received from the Data Out Register of FIG. 13.

A schematic of the DATA OUT register 80 (FIG. 8) is shown in FIG. 13 and explained with reference to the timing diagram of FIG. 14. The DATA OUTPUT register 80 includes three registers 300, 302, 304, each of which includes a first latch 308 and a second latch 310. Each of the latches 308, 310 is formed by a pair of inverters 312, 314 connected input-to-output, an input transmission gate 316 and an output transmission gate 318. The input transmission gates 316 are selectively enabled by respective data input signals EN1D–EN3D and their complements applied through respective inverters 330. When the respective data input signal EN1D–EN3D is high, the complement of the data signal DATA* is recorded in the latch 308 while the DATA signal is recorded in the latch 310.

The data registers 300, 302, 304 each operate in a similar manner. Specifically, the output of the latches 308, 310 are coupled through respective output transmission gates 318 when they are enabled by respective enable signals EN1–EN3 and their complements at the output of respective inverters 334. The output of the latches 308 are coupled to a first input of a NOR gate 340 while the outputs of the second latches 310 are applied to a first input of a second NOR gate 342. The second inputs of the NOR gates 340, 342 are coupled to the DQM-out terminal. The outputs of the NOR gates 340, 342 are coupled through respective inverters 346, 348 to generate the READ0* and READ1* signals, respectively.

In operation, the registers 300, 302, 304 are set to an initial condition by the RESET signal. Specifically, the RESET signal is applied to the gates of respective NMOS transistors 360 in each of the latches 308, 310. When reset is high, the transistors 360 are turned on to force the outputs of the latches 308, 310 high. With reference to FIG. 14, the data signals DATA and DATA* are coupled to each of the registers 300, 302, 304 by the respective data input enable signals EN1D–EN3D being high, and latched into each of the registers 300, 302, 304 when EN1D–EN3D, respectively each go low. The latched DATA and DATA signals are coupled out of the registers 300, 302, 304 by the respective data output enable signals EN1–EN3 being high. The data applied to the DATA OUT register 80 is present only during the period that the clock CLK signal is low. When the clock CLK signal is high, the data inputs float. Thus, at $t_0$, a first bit of data D0 is latched into the register 304 by the EN3D signal going low. Subsequently, at time $t_1$, a second bit of data is latched into the register 300 by the EN1D signal going low. At time $t_3$, a third bit of data D2 is latched into the register 302 by the EN2D signal going low. Note that, at $t_1$, $t_3$, $t_5$ when the respective data input enable signal EN1D–EN3D goes low, the corresponding enable signal EN1–EN3, respectively, is low so that data latched into the registers 300–304 is not immediately coupled to the outputs of the registers 300, 302, 304. Instead, the data coupled into the registers 300–304 is not coupled to their respective outputs until its respective enable signal EN1–EN3 goes high. Thus, it is not until $t_2$ when EN3 goes high that the first bit of data D0 is coupled out of the first register 300. Likewise, it is not until $t_4$ when the data bit D1 is coupled out of the second register 300 responsive to EN1 going high. Thus, it is apparent from FIG. 14 that data is coupled out of the data output register 80 on the READ0* and READ1* lines at least one and one-half clock periods after the DATA and DATA* signals have been applied to the data out register 80. This delay compensates for the read latency of a memory device with which the output buffer is used, as explained below. Note also, that the input data applied to the inputs of the registers 300, 302 and 304 is coupled directly to their respective outputs when data is initially coupled to each register. Thus, for example, at $t_1$, the input transmission gate 316 and the output transmission gate 318 for the register 302 are both enabled by the high EN2D and EN2 signals, respectively. However, the data output from the register 302, and the resulting READ0* and READ1* signals, are blocked by the transmission gates 45, 46 (FIG. 7) during this time. Thus, data applied to the registers 300, 302, 304 is not effectively applied to the DATA-OUT terminal until after the delay, explained above.

The foregoing explanation assumes that the DQM-OUT input to the data output register 80 is low, thereby enabling the NOR gates 340, 342. However, if the DQM-OUT signal goes high, the outputs of the NOR gates 340, 342 are forced low, thereby forcing READ0* and READ1* high. As explained above, when READ0* and READ1* are both high, they force the outputs of the output stage 24 (FIG. 5) to a tristate condition. Because of the delay and precise registry with the clock CLK signal of the DQM register 84 generating the DQM-OUT signal responsive to the DQM signal, the READ0* and READ1* signals are forced high when the correct data signals to be masked are being output from the respective register 300, 302, 304. However, as explained above with reference to FIG. 11, the timing of the DQM-OUT signal can be adjusted by one-half of a clock period depending upon the read latency of the memory device with which the output buffer 20 is used.

Figure 15:
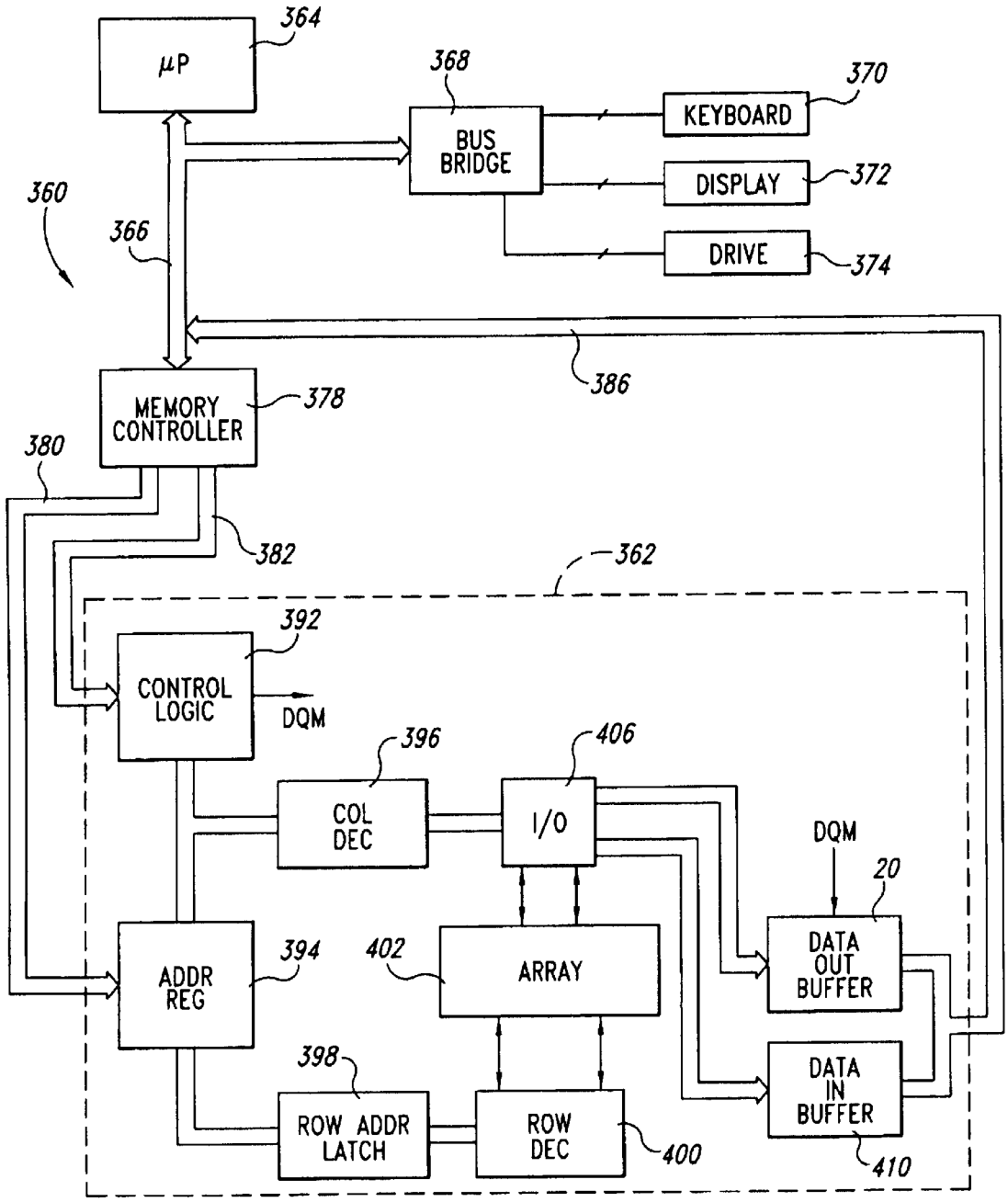
FIG. 15 is a block diagram of a computer system including a dynamic random access memory ("DRAM") using the data output buffer of FIG. 5.

A computer system 360 using a dynamic random access memory (DRAM) 362 having the preferred embodiment of the data output buffer 20 is illustrated in FIG. 15. The computer system 360 includes a conventional microprocessor 364 having a processor bus 366 which normally includes separate data, address and control/status busses. The processor bus 366 is connected through a conventional bus bridge 368 to an input device, such as a keyboard 370, and to an output device, such as a display 372, and to a mass storage device, such as a hard drive 374. The address and control/status buses of the processor bus 366 are also connected to a conventional memory controller 378. The memory controller 378 selectively outputs an address on an address bus 380 and a set of control and status signals on a control/status bus 382. The portion of the processor bus 366 constituting a data bus 386 is coupled to the data bus of the DRAM 362.

The DRAM 362 includes a control logic circuit 390 which generates various commands from the control signals received via bus 382. One of these signals is the data output mask DQM signal. The DRAM 362 also includes an address register 394 which couples an address received on the bus 380 to either a column decoder 396 or to a row address latch 398. A row address output from the row address latch 398 is decoded by a row decoder 400 which selects a corresponding row of memory cells in a memory array 402. A particular column of memory cells in the selected row is determined by the column signals output from the column decoder 396 which are coupled to the array 402 through an I/O circuit 406 which normally includes sense amplifiers, equilibration circuits, write drivers and the like. Data to be written into the array 402 is coupled through a data input buffer 410 to the I/O circuit 406 which then writes the data into the selected column of the selected row of memory cells in the array 402. Data is read from the array 402 by the I/O circuit 406 which then couples the data through the data output buffer to the data bus 386. As explained above, the data output buffer 20 includes a DQM input which causes the output of the data output buffer to assume a high impedance state. The computer system 360 shown in FIG. 15, including the DRAM 362, includes a significant amount of additional circuitry which has been omitted for purposes of brevity since such circuitry is conventional and is peripheral to the data output buffer 20.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An output buffer[s], comprising:

a data coder having complimentary data input terminals, a pair of data read output terminals, and a data mask control terminal, the data coder generating at respective first and second data read output terminals complimentary data read output signals corresponding to complimentary data input signals applied to respective data input terminals when an inactive data mask control signal is applied to the data mask control terminal, the data coder generating at the respective first and second data read output terminals data read output signals having predetermined values when an active data mask control signal is applied to the data mask control terminal, the data coder comprising:

a data mask register including the data mask control terminal, the data mask register receiving the data mask control signal on the data mask control terminal and a periodic clock signal on a clock input terminal, the data mask register generating an output signal responsive to a predetermined portion of the clock signal after the data mask control signal becomes active; and a data output register coupled to the data mask register and including the data input terminals and the data read output terminals, the data output register forcing the data read output signals to have the predetermined values responsive to the output signal from the data mask register; and an output stage having respective input terminals coupled to the first and second data read output terminals of the data coder, the output stage generating a data output signal at an output terminal that corresponds to the data read output signals from the data coder when the data read output signals do not have the predetermined values, the output stage producing a relatively high impedance at the data output terminal when the data read output signals have the predetermined values.

2. The output buffer of claim 1 wherein the predetermined values of the data read output signals are any values in which the data read output signals at the respective first and second data read output terminals have the same value.

3. The output buffer of claim 2 wherein the predetermined values of the data read output signal correspond to logic "1".

[4. The output buffer of claim 1 wherein the data mask register further comprises a latency control terminal adapted to receive a latency control signal, the data mask register altering the time when the data mask register generates the output signal as a function of the latency control signal.]

5. The output buffer of claim 1 wherein the data output register comprises a multi-phase signal generator receiving a periodic clock signal and generating from the clock signal a plurality of differently-phased enable and data input signals, and wherein the data output register further comprises a plurality of latches each receiving a respective differently-phased enable signal and a respective differently-phased data input signal, the latches being selectively coupled to the data input terminals responsive to their respective data input signals and being coupled to the data output terminal responsive to their respective enable signals, the data input signals being sequentially stored in each of the latches and being sequentially transferred from each of the latches to the data output terminals after being stored in each of the latches for a predetermined period.

6. The output buffer of claim 5 wherein the time that the data mask register generates the output signal after the data mask control signal becomes active corresponds to the predetermined period that the data input signals are stored in each of the latches.

7. An output buffer, comprising:

a data coder having complimentary data input terminals, a pair of data read output terminals, and a data mask control terminal, the data coder generating at respective first and second data read output terminals complimentary data read output signals corresponding to complimentary data input signals applied to respective data input terminals when an inactive data mask control signal is applied to the data mask control terminal, the data coder generating at the respective first and second data read output terminals data read output signals having predetermined values when an active data mask control signal is applied to the data mask control terminal*, the data coder having a data mask register, the data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, the data mask register having a latency control terminal adapted to receive a latency control signal, the data mask register altering the time when the data mask register generates the output signal as a function of the latency control signal, the data coder further including a data output register coupled to the data mask register and having the data input terminals and the data read output terminals, the data coder forcing the data read output signals to have the predetermined values responsive to the output signal from the data mask register*; and an output stage having respective input terminals coupled to the first and second data read output terminals of the data coder, the output stage generating a data output signal at an output terminal that corresponds to the data read output signals from the data coder when the data read output signals do not have the predetermined values, the output stage producing a relatively high impedance at the data output terminal when the data read output signals have the predetermined values, the output stage comprising:

a first switch coupled between a first voltage node and the data output terminal;

a second switch coupled between a second voltage node and the data output terminal; and a logic circuit that is structured to close the first switch responsive to one of the data read signals having the first predetermined logic level, open the first switch responsive to the one data read signal having other than the first predetermined logic level, close the second switch responsive to the other of the data read signals having the second predetermined logic level, and open the second switch responsive to the other data read signal having other than the second predetermined logic level so that the data output signal has a first logic level responsive to one of the data read output signals having a first predetermined logic level, the data output signal has a second logic level responsive to the other of the data read output signals having a second predetermined logic level, and the data output terminal has the relatively high impedance responsive to both of the read output signals having other than the first and second predetermined logic levels, respectively.

8. An output buffer, comprising:

a data mask register including a control terminal adapted to receive a DQM signal, the data mask register generating an output signal a predetermined period after receipt of the DQM signal, *the data mask register further having a latency control terminal adapted to receive a latency control signal, the data mask register altering the time when the data mask register generates the output signal as a function of the latency control signal*;

a data output register coupled to the data mask register and including a pair of complimentary data input terminals adapted to receive complimentary data input signals and a pair of data output terminals, the data output register generating respective output signals on the data output terminals having predetermined values responsive to receiving the output signal from the data mask register and having complimentary values corresponding to the data input signals at least part of the time that the output signal from the data mask register is not being received; and an output stage having respective input terminals coupled to the first and second data output terminals of the data output register, the output stage generating a data output signal at an output terminal that corresponds to the output signals from the data output register when the output signals from the data output register do not have the predetermined values, the output stage producing a relatively high impedance at the data output terminal when the output signals from the data output register have the predetermined values.

9. The output buffer of claim 8 wherein the predetermined values of the output signals from the data output register are any values in which the output signals at the respective first and second data output terminals have the same value.

10. The output buffer of claim 9 wherein the predetermined values of the output signals from the data output register correspond to logic "1".

11. The output buffer of claim 9 wherein the data output register generates the output signals on the respective data output terminals having predetermined values contemporaneously with receiving the output signal from the data mask register.

[12. The output buffer of claim 8 wherein the data mask register further comprises a latency control terminal adapted to receive a latency control signal, the data mask register altering the time when the data mask register generates the output signal as a function of the latency control signal.]

13. The output buffer of claim 8 wherein the data output register comprises a multi-phase signal generator receiving a periodic clock signal and generating from the clock signal a plurality of differently-phased data output enable and data input enable signals, and wherein the data output register further comprises a plurality of latches each receiving a respective differently-phased data input enable signal and a respective differently-phased data output enable signal, the latches being selectively coupled to the data input terminals of the data output register responsive to their respective data input enable signals and being coupled to the data output terminal responsive to their respective data output enable signals, the data input signals being sequentially stored in each of the latches and being sequentially transferred from each of the latches to the data output terminals after being stored in each of the latches for a predetermined period.

14. The output buffer of claim 13 wherein the time that the data mask register generates the output signal after receiving the DQM signal corresponds to the predetermined period that the data input signals are stored in each of the latches.

15. The output buffer of claim 8 wherein the output stage comprises a logic circuit that causes the data output signal to have a first logic level responsive to one of the output signals from the data output register having a first predetermined logic level, that causes the data output signal to have a second logic level responsive to the other of the output signals from the data output register having a second predetermined logic level, and that causes the data output terminal to have the relatively high impedance responsive to both of the output signals from the data output register having other than the first and second predetermined logic levels.

16. The output buffer of claim 15 wherein the output stage comprises:

a first switch coupled between a first voltage node and the data output terminal;

a second switch coupled between a second voltage node and the data output terminal; and wherein the logic circuit closes the first switch responsive to one of the output signals from the data output register having the first predetermined logic level, opens the first switch responsive to the output signals from the data output register having other than the first predetermined logic level, closes the second switch responsive to the other of the output signals from the data output register having the second predetermined logic level, and opens the second switch responsive to the output signals from the data output register having other than the second predetermined logic level.

17. A dynamic random access memory having an address bus, at least one data bit line, and a plurality of control lines, comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the array;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input data bit applied to the data bit line to a corresponding input data signal and a complimentary input data signal, and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data coder having complimentary data input terminals coupled to the data ports of the array to receive respective output data signals, a pair of data output terminals, and a data mask control terminal, the data coder generating at respective first and second data output terminals complimentary data read output signals corresponding to complimentary data output signals applied to the respective input terminals of the data coder when an inactive data mask control signal is applied to the data mask control terminal, the data coder generating at the respective first and second data output terminals data read output signals having predetermined values when an active data mask control signal is applied to the data mask control terminal, the data coder comprising:

a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, *the data mask register further having a latency control terminal adapted to receive a latency control signal, the data mask register altering the time when the data mask register generates the output signal as a function of the latency control signal*; and a data output register coupled to the data mask register and including the data input terminals and the data read output terminals, the data coder forcing the data read output signals to have the predetermined values responsive to the output signal from the data mask register; and an output stage having respective input terminals coupled to the first and second data output terminals of the data coder, the output stage generating the output data bit at data bit line that corresponds to the data read output signals from the data coder when the data read output signals do not have the predetermined values, the output stage producing a relatively high impedance at the data bit line when the data read output signals have the predetermined values.

18. The dynamic random access memory of claim 17 wherein the predetermined values of the data read output signals are any values in which the data read output signals at the respective data output terminals of the data coder have the same value.

19. The dynamic random access memory of claim 18 wherein the predetermined values of the data read output signal correspond to logic "1".

[20. The dynamic random access memory of claim 17 wherein the data mask register further comprises a latency control terminal adapted to receive a latency control signal, the data mask register altering the time when the data mask register generates the output signal as a function of the latency control signal.]

21. The dynamic random access memory of claim 17 wherein the data output register comprises a multi-phase signal generator receiving a periodic clock signal and generating from the clock signal a plurality of differently-phased input data enable signals and output data enable signals, and wherein the data output register further comprises a plurality of latches each receiving a respective differently-phased input data enable signal and a respective differently-phased output data enable signal, the latches being selectively coupled to the data input terminals responsive to their respective input data enable signals and being coupled to the data read output terminals responsive to their respective output data enable signals, the output data signals from the data ports of the array being sequentially stored in each of the latches and being sequentially transferred from each of the latches to the data read output terminals after being stored in each of the latches for a predetermined period.

22. The dynamic random access memory of claim 21 wherein the time that the data mask register generates the output signal after the data mask control signal becomes active corresponds to the predetermined period that the output data signals from the data ports of the array are stored in each of the latches.

23. A dynamic random access memory having an address bus, at least one data bit line, and a plurality of control lines, comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the array;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input data bit applied to the data bit, line to a corresponding input data signal and a complimentary input data signal and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data coder having complimentary data input terminals coupled to the data ports of the array to receive respective output data signals, a pair of data output terminals, and a data mask control terminal, the data coder generating at respective first and second data output terminals complimentary data read output signals corresponding to complimentary data output signals applied to the respective input terminals of the data coder when an inactive data mask control signal is applied to the data mask control terminal, the data coder generating at the respective first and second data output terminals data read output signals having predetermined values when an active data mask control signal is applied to the data mask control terminal, *the data coder having a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, the data mask register further including a latency control terminal adapted to receive a latency control signal, the data mask register altering the time when the data mask register generates the output signal as a function of the latency control signal, the data coder further having a data output register coupled to the data mask register and including the data input terminals and the data read output terminals, the data coder forcing the data read output signals to have the predetermined values responsive to the output signal from the data mask register*; and an output state having respective input terminals coupled to the first and second data output terminals of the data coder, the output stage generating the output data bit at data bit line that corresponds to the data read output signals from the data coder when the data read output signals do not have the predetermined values, the output stage producing a relatively high impedance at the data bit line when the data read output signals have the predetermined values, the output stage comprising:

a first switch coupled between a first voltage node and the output data bit;

a second switch coupled between a second voltage node and the output data bit; and a logic circuit that is structured to close the first switch responsive to one of the data read signals having the first predetermined logic level, open the first switch responsive to the one data read signal having other than the first predetermined logic level, close the second switch responsive to the other of the data read signals having the second predetermined logic level, and open the second switch responsive to the other data read signal having other than the second predetermined logic level so that the output data bit has a first logic level responsive to one of the data read output signals having a first predetermined logic level, the output data bit has a second logic level responsive to the other of the data read output signals having a second predetermined logic level, and the data bit line has the relatively high impedance responsive to both of the read output signals having other than the first and second predetermined logic levels, respectively.

24. A computer system, comprising:

a processor having a processor data bus, address bus, and control bus;

an input device coupled to the processor;

an output device coupled to the processor;

a memory controller coupled to the processor; and a dynamic random access memory having an address bus, at least one data bit line, and a plurality of control lines at least some of which are coupled to the memory controller, the dynamic random access memory comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the array;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input data bit applied to the data bit line to a corresponding input data signal and a complimentary input data signal, and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data coder having complimentary data input terminals coupled to the data ports to the array to receive respective output data signals, a pair of data output terminals, and a data mask control terminal, the data coder generating at respective first and second data output terminals complimentary data read output signals corresponding to complimentary data output signals applied to the respective input terminals of the data coder when an inactive data mask control signal is applied to the data mask control terminal, the data coder generating at the respective first and second data output terminals data read output signals having predetermined values when an active data mask control signal is applied to the data mask control terminal, the data coder comprising:

a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, *the data mask register further having a latency control terminal adapted to receive a latency control signal, the data mask register altering the time when the data mask register generates the output signal as a function of the latency control signal*; and a data output register coupled to the data mask register and including the data input terminals and the data read output terminals, the data coder forcing the data read output signals to have the predetermined values responsive to the output signal from the data mask register and an output stage having respective input terminals coupled to the first and second data output terminals of the data coder, the output stage generating the output data bit at data bit line that corresponds to the data read output signals from the data coder when the data read output signals do not have the predetermined values, the output stage producing a relatively high impedance at the data bit line when the data read output signals have the predetermined values.

25. The computer system of claim 24 wherein the predetermined values of the data read output signals are any values in which the data read output signals at the respective data output terminals of the data coder have the same value.

26. The computer system of claim 25 wherein the predetermined values of the data read output signal correspond to logic "1".

[27. The computer system of claim 24 wherein the data mask register further comprises a latency control terminal adapted to receive a latency control signal, the data mask register altering the time when the data mask register generates the output signal as a function of the latency control signal.]

28. The computer system of claim 24 wherein the data output register comprises a multi-phase signal generator receiving a periodic clock signal and generating from the clock signal a plurality of differently-phased input data enable signals and output data enable signals, and wherein the data output register further comprises a plurality of latches each receiving a respective differently-phased input data enable signal and a respective differently-phased output data enable signal, the latches being selectively coupled to the data input terminals responsive to their respective input data enable signals and being coupled to the data read output terminals responsive to their respective output data enable signals, the output data signals from the data ports of the array being sequentially stored in each of the latches and being sequentially transferred from each of the latches to the data read output terminals after being stored in each of the latches for a predetermined period.

29. The computer system of claim 28 wherein the time that the data mask register generates the output signal after the data mask control signal becomes active corresponds to the predetermined period that the output data signals from the data ports of the array are stored in each of the latches.

30. A computer system, comprising:

a processor having a processor data bus, address bus, and control bus;

an input device coupled to the processor;

an output device coupled to the processor;

a memory controller coupled to the processor; and a dynamic random access memory having an address bus, at least one data bit line, and a plurality of control lines at least some of which are coupled to the memory controller, the dynamic random access memory comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the array;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input data bit applied to the data bit line to a corresponding input data signal and a complimentary input data signal, and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data coder having complimentary data input terminals coupled to the data ports of the array to receive respective output data signals, a pair of data output terminals, and a data mask control terminal, the data coder generating at respective first and second data output terminals complimentary data read output signals corresponding to complimentary data output signals applied to the respective input terminals of the data coder when an inactive data mask control signal is applied to the data mask control terminal, the data coder generating at the respective first and second data output terminals data read output signals having predetermined values when an active data mask control signal is applied to the data mask control terminal, *the data coder having a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, the data mask register further including a latency control terminal adapted to receive a latency control signal, the data mask register altering the time when the data mask register generates the output signal as a function of the latency control signal, the data coder further having a data output register coupled to the data mask register and including the data input terminals and the data read output terminals, the data coder forcing the data read output signals to have the predetermined values responsive to the output signal from the data mask register*; and an output stage having respective input terminals coupled to the first and second data output terminals of the data coder, the output stage generating the output data bit at data bit line that corresponds to the data read output signals from the data coder when the data read output signals do not have the predetermined values, the output stage producing a relatively high impedance at the data bit line when the data read output signals have the predetermined values, the output stage comprising:

a first switch coupled between a first voltage node and the output data bit;

a second switch coupled between a second voltage node and the output data bit; and a logic circuit that is structured to close the first switch responsive to one of the data read signals having the first predetermined logic level, open the first switch responsive to the one data read signal having other than the first predetermined logic level, close the second switch responsive to the other of the data read signals having the second predetermined logic level, and open the second switch responsive to the other data read signal having other than the second predetermined logic level so that the output data bit has a first logic level responsive to one of the data read output signals having a first predetermined logic level, output data bit has a second logic level responsive to the other of the data read output signals having a second predetermined logic level, and the data bit line has the relatively high impedance responsive to both of the read output signals having other than the first and second predetermined logic levels.

31. A dynamic random access memory having an address bus, at least one data bit line, and a plurality of control lines, comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the array;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input data bit applied to the data bit line to a corresponding input data signal and a complimentary input data signal, and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data mask register including a control terminal adapted to receive a DQM signal, the data mask register generating an output signal a predetermined period after receipt of the DQM signal, *the data mask register further having a latency control terminal adapted to receive a latency control signal, the data mask register altering the time when the data mask register generates the output signal as a function of the latency control signal*; *and* a data output receipt coupled to the data mask register and including a pair of complimentary data input terminals adapted to receive complimentary data input signals and a pair of data output terminals, the data output register generating respective output signals on the data output terminals having predetermined values responsive to receiving the output signal from the data mask register and having complimentary values corresponding to the data input signals at least part of the time that the output signal from the data mask register is not being received; and an output stage having respective input terminals coupled to the first and second data output terminals of the data output register, the output stage generating a data output signal at an output terminal that corresponds to the output signals from the data output register when the output signals from the data output register do not have the predetermined values, the output stage producing a relatively high impedance at the data output terminal when the output signals from the data output register have the predetermined values.

32. The output buffer of claim 31 wherein the predetermined values of the output signals from the data output register are any values in which the output signals at the respective first and second data output terminals have the same value.

33. The output buffer of claim 32 wherein the predetermined values of the output signals from the data output register correspond to logic "1".

34. The output buffer of claim 32 wherein the data output register generates the output signals on the respective data output terminals having predetermined values contemporaneously with receiving the output signal from the data mask register.

[35. The output buffer of claim 31 wherein the data mask register further comprises a latency control terminal adapted to receive a latency control signal, the data mask register altering the time when the data mask register generates the output signal as a function of the latency control signal.]

36. The output buffer of claim 31 wherein the data output register comprises a multi-phase signal generator receiving a periodic clock signal and generating from the clock signal a plurality of differently-phased data output enable and data input enable signals, and wherein the data output register further comprises a plurality of latches each receiving a respective differently-phased data input enable signal and a respective differently-phased data output enable signal, the latches being selectively coupled to the data input terminals of the data output register responsive to their respective data input enable signals and being coupled to the data output terminal responsive to their respective data output enable signals, the data input signals being sequentially stored in each of the latches and being sequentially transferred from each of the latches to the data output terminals after being stored in each of the latches for a predetermined period.

37. The output buffer of claim 36 wherein the time that the data mask register generates the output signal after receiving the DQM signal corresponds to the predetermined period that the data input signals are stored in each of the latches.

38. The output buffer of claim 31 wherein the output stage comprises a logic circuit that causes the data output signal to have a first logic level responsive to one of the output signals from the data output register having a first predetermined logic level, that causes the data output signal to have a second logic level responsive to the other of the output signals from the data output register having a second predetermined logic level, and that causes the data output terminal to have the relatively high impedance responsive to both of the output signals from the data output register having other than the first and second predetermined logic levels.

39. The output buffer of claim 38 wherein the output stage comprises:

a first switch coupled between a first voltage node and the data output terminal;

a second switch coupled between a second voltage node and the data output terminal; and wherein the logic circuit closes the first switch responsive to one of the output signals from the data output register having the first predetermined logic level, opens the first switch responsive to the output signals from the data output register having other than the first predetermined logic level, closes the second switch responsive to the other of the output signals from the data output register having the second predetermined logic level, and opens the second switch responsive to the output signals from the data output register having other than the second predetermined logic level.

40. An output buffer, comprising:

a data coder having complimentary data input terminals, a pair of data read output terminals, and a data mask control terminal, the data coder generating at respective first and second data read output terminals complimentary data read output signals corresponding to complimentary data input signals applied to respective data input terminals when an inactive data mask control signal is applied to the data mask control terminal, the data coder generating at the respective first and second data read output terminals data read output signals having predetermined values when an active data mask control signal is applied to the data mask control terminal, *the data coder having a data mask register, the data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active, the data mask register having a latency control terminal adapted to receive a latency control signal, the data mask register altering the time when the data mask register generates the output signal as a function of the latency control signal, the data coder further including a data output register coupled to the data mask register and having the data input terminals and the data read output terminals, the data coder forcing the data read output signals to have the predetermined values responsive to the output signal from the data mask register*; and an output stage having respective input terminals coupled to the first and second data read output terminals of the data coder, the output stage generating a data output signal at an output terminal the corresponds to the data read output signals from the data coder when the data read output signals do not have the predetermined values, the output stage producing a relatively high impedance at the data output terminal when the data read output signals have the predetermined values, the output stage comprising:

a first switch coupled between a first voltage node and the data output terminal;

a second switch coupled between a second voltage node and the data output terminal; and a logic circuit that is structured to close the first switch responsive to one of the data read signals having the first predetermined logic level, open the first switch responsive to the one data read signal having other than the first predetermined logic level, close the second switch responsive to the other of the data read signals having the second predetermined logic level, and open the second switch responsive to the other data read signal having other than the second predetermined logic level.

41. The output buffer of claim 40 wherein the predetermined values of the data read output signals are any values in which the data read output signals at the respective first and second data read output terminals have the same value.

42. The output buffer of claim 41 wherein the predetermined values of the data read output buffer correspond to logic "1".

[43. The output buffer of claim 40 wherein the data coder comprises:

a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active; and a data output register coupled to the data mask register and including the data input terminals and the data read output terminals, the data coder forcing the data read output signals to have the predetermined values responsive to the output signal from the data mask register.]

[44. The output buffer of claim 43 wherein the data mask register further comprising a latency control terminal adapted to receive a latency control signal, the data mask register altering the time when the data mask register generates the output signal as a function of the latency control signal.]

45. The output buffer of claim [43] *40* wherein the data output register comprises a multi-phase signal generator receiving a periodic clock signal and generating from the clock signal a plurality of differently-phased enable and data input signals, and wherein the data output register further comprises a plurality of latches each receiving a respective differently-phased enable signal and a respective differently-phased data input signal, the latches being selectively coupled to the data input terminals responsive to their respective data input signals and being coupled to the data output terminal responsive to their respective enable signals, the data input signals being sequentially stored in each of the latches and being sequentially transferred from each of the latches to the data output terminals after being stored in each of the latches for a predetermined period.

46. The output buffer of claim 45 wherein the time that the data mask register generates the output signal after the data mask control signal becomes active corresponds to the predetermined period that the data input signals are stored in each of the latches.

47. A dynamic random access memory having an address bus, at least one data bit line, and a plurality of control lines, comprising:

an array of memory cells having a plurality of memory cells, a plurality of row lines, a plurality of complimentary digit lines, and a pair of complimentary data ports;

a row address decoder coupled to the address bus, the row address decoder adapted to receive a row address on the address bus and activate a corresponding one of the row lines of the arrays;

a column address decoder coupled to the address bus, the column address decoder adapted to receive a column address on the address bus and couple a corresponding pair of complimentary digit lines of the array to respective data ports of the array; and a data path coupled between the data ports and a data bit line, the data path including a input data buffer adapted to convert an input path bit applied to the data bit line to a corresponding input data signal and a complimentary input data signal, and to apply the input data signals to respective data ports of the array, and an output data buffer adapted to convert an output data signal and a complimentary output data signal applied to respective data ports of the array to an output data bit corresponding to the output data signal, and to apply the output data signal to the data bit line, the output buffer comprising:

a data coder having complimentary data input terminals coupled to the data ports of the array to receive respective output data signals, a pair of data output terminals, and a data mask control terminal, the data coder generating at respective first and second data output terminals complimentary data read output signals corresponding to complimentary data output signals applied to the respective input terminals of the data coder when an inactive data mask control signal is applied to the data mask control terminal, the data coder generating at the respective first and second data output terminals data read output signals having predetermined values when an active data mask control signal is applied to the data mask control terminal, the data coder having a data mask register including the data mask control terminal, *the data mask register receiving the data mask control signal on the data mask control terminal and a periodic clock signal on a clock input terminal, the register generating an output signal responsive to a predetermined portion of the clock signal after the data mask control signal becomes active, the data mask register further including a latency control terminal adapted to receive a latency control signal, the data mask register altering the time when the data mask register generates the output signal as a function of the latency control signal, the data coder further having a data output register coupled to the data mask register and including the data input terminals and the data read output terminals, the data coder forcing the data read output signals to have the predetermined values responsive to the output signal from the data mask register*; and an output stage having respective input terminals coupled to the first and second data output terminals of the data coder, the output stage generating the output data bit at data bit line that corresponds to the data read output signals from the data coder when the data read output signals do not have the predetermined values, the output stage producing a relatively high impedance at the data bit line when the data read output signals have the predetermined values, the output stage comprising:

a first switch coupled between a first voltage node and the output data bit;

a second switch coupled between a second voltage node and the output data bit; and a logic circuit that is structured to close the first switch responsive to one of the data read signals having the first predetermined logic level, open the first switch responsive to the one data read signal having other than the first predetermined logic level, close the second switch responsive to the other of the data read signals having the second predetermined logic level, and open the second switch responsive to the other data read signal having other than the second predetermined logic level.

48. The dynamic random access memory of claim 47 wherein the predetermined values of the data read output signals are any values in which the data read output signals at the respective data output terminals of the data coder have the same value.

49. The dynamic random access memory of claim 48 wherein the predetermined values of the data read output signal correspond to logic "1".

[50. The dynamic random access memory of claim 47 wherein the data coder comprises:

a data mask register including the data mask control terminal, the data mask register receiving the data mask control signal on the data mask control terminal and a periodic clock signal on a clock input terminal, the register generating an output signal responsive to a predetermined portion of the clock signal after the data mask control signal becomes active; and a data control register coupled to the data mask register and including the data input terminals and the data read output terminals, the data coder forcing the data read output signals to have the predetermined values responsive to the output signal from the data mask register.]

[51. The dynamic random access memory of claim 50 wherein the data mask register further comprises a latency control terminal adapted to receive a latency control signal, the data mask register altering the time when the data mask register generates the output signal as a function of the latency control signal.]

52. The dynamic random access memory of claim [50] *47* wherein the data output register comprises a multi-phase signal generator receiving a periodic clock signal and generating from the clock signal a plurality of differently-phased input data enable signals and output data enable signals, and wherein the data output register further comprises a plurality of latches each receiving a respective differently-phased input data enable signal and a respective differently-phased output data enable signal, the latches being selectively coupled to the data input terminals responsive to their respective input data enable signals and being coupled to the data read output terminals responsive to their respective output data enable signals, the output data signals from the data ports of the array being sequentially stored in each of the latches and being sequentially transferred from each of the latches to the data read output terminals after being stored in each of the latches for a predetermined period.

53. The dynamic random access memory of claim 52 wherein the time that the data mask register generates the output signal after the data mask control signal becomes active corresponds to the predetermined period that the output data signals from the data ports of the array are stored in each of the latches.

*54. A method of masking data coupled through a data output buffer responsive to a data mask signal applied to the output buffer, the output buffer having first and second stages connected in series with each other, the method comprising:*

*registering a signal representing the data mask signal in response to a first clock edge of a clock signal for a first latency setting and in response to a second clock edge of the clock signal for a second latency setting;*

*coupling first and second input terminals at which complimentary first and second data signals are applied, respectively, to respective first and second output terminals of the first stage when the data mask signal is inactive;*

*generating a control signal responsive to a predetermined portion of a clock signal after the data mask signal becomes active;*

*applying respective predetermined signals to the first and second output terminals of the first stage responsive to the control signal;*

*applying a data output signal to an output terminal of the second stage corresponding to the complimentary first and second data signals when the respective predetermined signals are not being applied to the first and second input terminals of the second stage; and*

*tri-stating the output terminal of the second stage when the respective predetermined signals are being applied to the first and second input terminals of the second stage.*

*55. The method of claim 54 wherein the respective predetermined signals applied to the first and second output terminals of the first stage are any signals that are not complimentary to each other.*

*56. The method of claim 55 wherein the predetermined signals correspond to logic "1".*

*57. The method of claim 54 wherein the coupling of the first and second input terminals to the respective first and second output terminals of the first stage is delayed in time so that the complimentary first and second data signals are stored in the first stage for a predetermined time.*

*58. A method of selectively masking complimentary read data signals responsive to a data mask signal, comprising:*

*registering a signal representing the data mask signal in response to a first clock edge of a clock signal for a first latency setting and in response to a second clock edge of the clock signal for a second latency setting;*

*generating coded read data signals corresponding to the complimentary read data signals in the absence of the data mask signal;*

*a predetermined period after receipt of the data mask signal, generating coded read data signals coded in a predetermined manner responsive to the data mask signal;*

*generating on a data output terminal an output signal having a value corresponding to the coded read data signals if the coded read data signals are not coded in the predetermined manner; and*

*placing the data output terminal at a high impedance if the coded read data signals are coded in the predetermined manner.*

*59. The method of claim 58 wherein the predetermined manner of coding is for the coded read data signals to have the same value.*

*60. A method of masking data coupled through a data output buffer responsive to a data mask signal applied to the output buffer, the output buffer having first and second stages connected in series with each other, the method comprising:*

*registering a signal representing the data mask signal in response to a first clock edge of a clock signal for a first latency setting and in response to a second clock edge of the clock signal for a second latency setting;*

*coupling first and second input terminals at which complimentary first and second data signals are applied, respectively, to respective first and second output terminals of the first stage to provide first and second read output signals, respectively, to the second stage when the data mask signal is inactive;*

*applying respective predetermined signals to the first and second output terminals of the first stage to provide the first and second read output signals, respectively, to the second stage when the data mask signal is active;*

*coupling an output terminal of the second stage to a first voltage node responsive to one of the data read output signals having a first predetermined logic level;*

*coupling the output terminal of the second stage to a second voltage node responsive to the other of the data read output signals having a second predetermined logic level; and*

*electrically isolating the output terminal of the second stage from the first and second voltage nodes responsive to both the data read output signals having other than the first or second predetermined logic levels.*

*61. The method of claim 60 wherein the respective predetermined signals applied to the first and second output terminals of the first stage are any signals that are not complimentary to each other.*

*62. The method of claim 61 wherein the predetermined signals correspond to logic "1".*

*63. The method of claim 60 wherein the coupling of the first and second input terminals to the respective first and second output terminals of the first stage is delayed in time so that the complimentary first and second data signals are stored in the first stage for a predetermined time.*

*64. A method of selectively masking complimentary read data signals responsive to a data mask signal, comprising:*

*registering a signal representing the data mask signal in response to a first clock edge of a clock signal for a first latency setting and in response to a second clock edge of the clock signal for a second latency setting;*

*generating first and second coded read data signals corresponding to the complimentary read data signals, respectively, in the absence of the data mask signal;*

*coding the first and second coded read data signals in a predetermined manner responsive to the data mask signal;*

*coupling a data output terminal to a first voltage node responsive to one of the coded read data signals having a first predetermined logic level;*

*coupling the data output terminal to a second voltage node responsive to the other of the coded read data signals having a second predetermined logic level; and*

*electrically isolating the data output terminal from the first and second voltage nodes if the coded read data signals are coded in the predetermined manner.*

*65. The method of claim 64 wherein the predetermined manner of coding is for the coded read data signals to have the same value.*

*66. A method of selectively masking complimentary read data signals responsive to a data mask signal, comprising:*

*registering a signal representing the data mask signal in response to a first clock edge of a clock signal for a first latency setting and in response to a second clock edge of the clock signal for a second latency setting;*

*generating coded read data signals corresponding to the complimentary read data signals in the absence of the data mask signal;*

*generating coded read data signals coded in a predetermined manner responsive to the data mask signal;*

*coupling a data output terminal to a first voltage node responsive to one of the coded read data signals having a first predetermined logic level;*

*coupling the data output terminal to a second voltage node responsive to the other of the coded read data signals having a second predetermined logic level; and*

*electrically isolating the data output terminal from the first and second voltage nodes if the coded read data signals are coded in the predetermined manner.*

*67. The method of claim 66 wherein the predetermined manner of coding is for the coded read data signals to have the same value.*

* * * * *